(12) United States Patent
Jeon et al.

(10) Patent No.: US 12,101,971 B2
(45) Date of Patent: Sep. 24, 2024

(54) DISPLAY APPARATUS AND METHOD OF MANUFACTURING THE SAME

(71) Applicant: Samsung Display Co., Ltd., Yongin-si (KR)

(72) Inventors: Joohee Jeon, Yongin-si (KR); Donghwan Shim, Yongin-si (KR); Sanghee Jang, Yongin-si (KR); Chungsock Choi, Yongin-si (KR); Sungjin Hong, Yongin-si (KR); Junki Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 389 days.

(21) Appl. No.: 17/527,039

(22) Filed: Nov. 15, 2021

(65) Prior Publication Data
US 2022/0208912 A1    Jun. 30, 2022

(30) Foreign Application Priority Data
Dec. 29, 2020   (KR) .......................... 10-2020-0186772

(51) Int. Cl.
*H10K 59/12*   (2023.01)
*H10K 59/121*   (2023.01)
*H10K 59/123*   (2023.01)
*H10K 59/124*   (2023.01)
*H10K 59/35*   (2023.01)

(52) U.S. Cl.
CPC ....... *H10K 59/124* (2023.02); *H10K 59/1213* (2023.02); *H10K 59/1216* (2023.02); *H10K 59/123* (2023.02); *H10K 59/351* (2023.02); *H10K 59/353* (2023.02)

(58) Field of Classification Search
CPC .............. H10K 59/124; H10K 59/353; H10K 59/1213; H10K 59/351; H10K 59/1216; H10K 59/123
USPC ........................... 257/40; 438/82, 99
See application file for complete search history.

(56) References Cited

U.S. PATENT DOCUMENTS

| | | | |
|---|---|---|---|
| 9,978,813 B2 | 5/2018 | Kang et al. | |
| 10,672,802 B2 | 6/2020 | Lee et al. | |
| 2018/0366586 A1* | 12/2018 | Son | H01L 27/1218 |
| 2020/0235187 A1* | 7/2020 | Bae | H10K 59/124 |
| 2020/0258967 A1* | 8/2020 | Kim | H10K 59/17 |

(Continued)

FOREIGN PATENT DOCUMENTS

| | | |
|---|---|---|
| CN | 109950284 | 6/2019 |
| CN | 111063719 | 4/2020 |

(Continued)

*Primary Examiner* — Didarul A Mazumder
(74) *Attorney, Agent, or Firm* — KILE PARK REED & HOUTTEMAN PLLC

(57) ABSTRACT

A display apparatus includes: a substrate including a main display area, a component area, and a peripheral area; a first insulating layer disposed over the substrate; a second insulating layer disposed over the first insulating layer and including an opening exposing at least a portion of the first insulating layer; an auxiliary subpixel disposed over the component area; an auxiliary pixel circuit disposed over the peripheral area and including an auxiliary thin film transistor and an auxiliary storage capacitor; and a transparent connection line connecting the auxiliary subpixel to the auxiliary pixel circuit and at least partially disposed over the component area.

21 Claims, 21 Drawing Sheets

(56) References Cited

U.S. PATENT DOCUMENTS

2020/0273927 A1* 8/2020 Oh .......................... H10K 77/10
2020/0365664 A1* 11/2020 Jeon ....................... H10K 71/00
2020/0365667 A1* 11/2020 Jo ........................... H10K 59/00

FOREIGN PATENT DOCUMENTS

| CN | 111627339 | 9/2020 |
| KR | 10-2017-0031847 | 3/2017 |
| KR | 10-2019-0064716 | 6/2019 |

* cited by examiner

DISPLAY APPARATUS AND METHOD OF MANUFACTURING THE SAME

CROSS-REFERENCE TO RELATED APPLICATION

This application claims priority from and the benefit of Korean Patent Application No. 10-2020-0186772, filed on Dec. 29, 2020, which is hereby incorporated by reference for all purposes as if fully set forth herein.

BACKGROUND

Field

Embodiments of the invention relate generally to a display apparatus and a method of manufacturing the display apparatus and more particularly, to a display apparatus having a display area extending to an area where a component is arranged and a method of manufacturing the display apparatus.

Discussion of the Background

Recently, display apparatuses have been used for various purposes. Also, as display apparatuses have become thinner and lighter, their usages have been widened and expanded to various fields.

As display apparatuses are used in various ways, various methods may be used to design the shapes of display apparatuses, and further, additional functions may be combined or associated with display apparatuses.

The above information disclosed in this Background section is only for understanding of the background of the inventive concepts, and, therefore, it may contain information that does not constitute prior art.

SUMMARY

Display devices constructed according to the principles of invention have a display area extending to a component area, in which a component such as an electronic element is disposed, by implementing display elements in the component area. The display devices have a high transmittance in the component area by implementing pixel circuits for driving the display elements in a peripheral area surrounding the display area.

Methods of manufacturing the display devices according to the principles of the invention are capable of providing a display area extending to a component area, in which a component such as an electronic element is disposed, by implementing display elements in the component area, and capable of providing the component area having a high transmittance by implementing pixel circuits for driving the display elements in a peripheral area surrounding the display area.

Additional features of the inventive concepts will be set forth in the description which follows, and in part will be apparent from the description, or may be learned by practice of the inventive concepts.

According to an aspect of the invention, a display apparatus includes a substrate including a main display area, a component area, and a peripheral area, a first insulating layer disposed over the substrate, a second insulating layer disposed over the first insulating layer and including an opening exposing at least a portion of the first insulating layer, an auxiliary subpixel disposed over the component area, an auxiliary pixel circuit disposed over the peripheral area and including an auxiliary thin film transistor and an auxiliary storage capacitor, and a transparent connection line connecting the auxiliary subpixel to the auxiliary pixel circuit and at least partially disposed over the component area.

The transparent connection line may be disposed in the opening.

The transparent connection line may be disposed directly on the first insulating layer, the component area may be an auxiliary display area having a transmission area, the auxiliary subpixel may be an auxiliary light emitting element, and the auxiliary pixel circuit may be configured to drive the auxiliary light emitting element.

The transparent connection line may have a thickness of about 100 Å to about 2,000 Å.

The first insulating layer and the second insulating layer may include different materials, and the second insulating layer may be disposed directly on the first insulating layer.

The first insulating layer may include silicon oxide, and the second insulating layer may include silicon nitride.

The opening may overlap the component area.

The opening may overlap at least a portion of the peripheral area.

The display apparatus may further include a metal connection line electrically connected to the transparent connection line and disposed over the peripheral area.

The display apparatus may further include a first organic insulating layer disposed over the first insulating layer, and a second organic insulating layer disposed over the first organic insulating layer.

The metal connection line may be disposed over the second insulating layer of the peripheral area.

The metal connection line and the transparent connection line may be electrically connected through a connection line disposed over the first organic insulating layer.

One end of the connection line may be electrically connected to the metal connection line through a first contact hole, and another end of the connection line may be electrically connected to the transparent connection line through a second contact hole.

The metal connection line may be disposed over the first organic insulating layer.

In the present embodiments, the metal connection line and the transparent connection line may be electrically connected through a third contact hole formed in the first organic insulating layer.

The metal connection line may be disposed over the second organic insulating layer.

The metal connection line and the transparent connection line may be electrically connected through a connection line disposed over the first organic insulating layer.

One end of the connection line may be electrically connected to the metal connection line through a fourth contact hole, and another end of the connection line may be electrically connected to the transparent connection line through a fifth contact hole.

The display apparatus may further include a main pixel circuit including a main thin film transistor and a main storage capacitor disposed over the main display area, and a main subpixel disposed over the main display area and electrically connected to the main pixel circuit, wherein the first insulating layer and the second insulating layer may be disposed between the main pixel circuit and the main subpixel.

The component area and the main subpixel most adjacent to the component area may be spaced apart from each other by about 10 μm or more.

According to another aspect of the invention, a display apparatus includes: a substrate including a main display area, an auxiliary display area having a transmission area, and a peripheral area; a first insulating layer extending to overlap the main display area, the auxiliary display area, and the peripheral area; a second insulating layer disposed over the first insulating layer and including an opening exposing at least a portion of the first insulating layer in the auxiliary display area; an auxiliary subpixel including an auxiliary light emitting element disposed in the auxiliary display area and an auxiliary pixel circuit disposed in the peripheral area, the auxiliary pixel circuit configured to drive the auxiliary light emitting element; and a transparent connection line connecting the auxiliary light emitting element to the auxiliary pixel circuit and at least partially disposed over the auxiliary display area.

According to another aspect of the invention, a method of manufacturing a display apparatus includes the steps of forming an interlayer insulating layer including a first insulating layer and a second insulating layer including a different material than the first insulating layer over a substrate including a main display area, a component area, and a peripheral area, at least partially removing the second insulating layer disposed in the component area and the second insulating layer disposed in the peripheral area, forming a metal connection line over the second insulating layer of the peripheral area, and forming a transparent connection line over at least a portion of the peripheral area and the component area from which the second insulating layer has been removed.

The method may further include the steps of forming a first organic insulating layer over the metal connection line and the transparent connection line, and forming a connection line over the first organic insulating layer.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
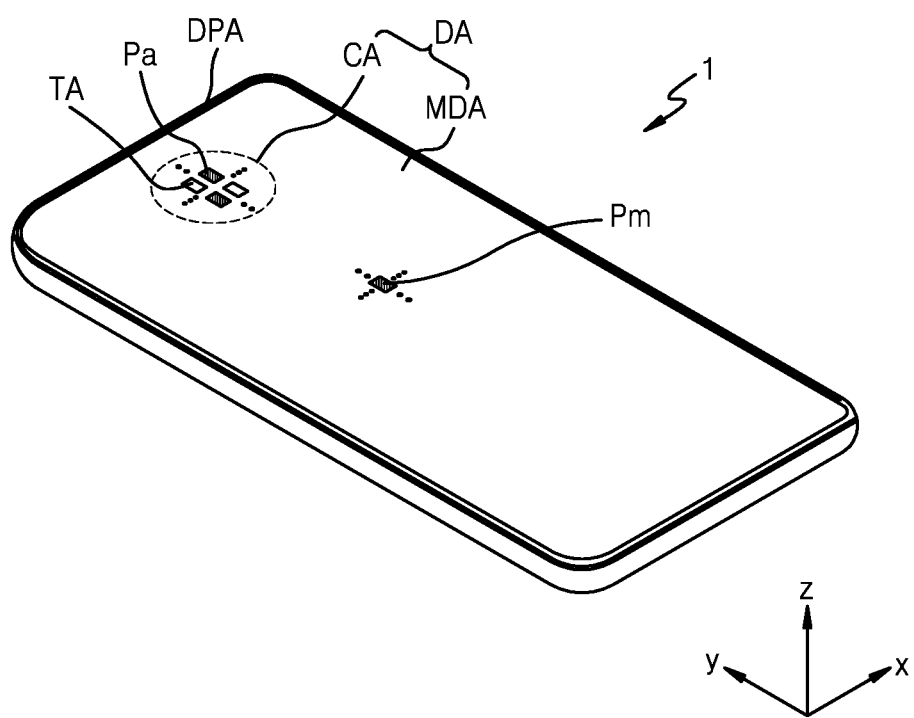
FIG. 1 is a perspective view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In the following embodiments, the meaning of a line "extending in a first direction or a second direction" may include not only extending in a linear shape but also extending in a zigzag or curved shape along the first direction or the second direction.

In the following embodiments, when referred to as "in a plan view," it may mean that a target portion is viewed from above, and when referred to as "in a cross-sectional view," it may mean that a cross-section of a target portion vertically cut is viewed from side. In the following embodiments, when referred to as "overlapping," it may include overlapping "in a plan view" and overlapping "in a cross-sectional view."

Hereinafter, embodiments will be described in detail with reference to the accompanying drawings, and in the following description, like reference numerals will denote like elements.

FIG. 1 is a perspective view schematically illustrating a display apparatus according to an embodiment.

Referring to FIG. 1, a display apparatus 1 may include a display area DA and a peripheral area DPA outside the display area DA. The display area DA may include a component area CA (e.g., an auxiliary display area) and a main display area MDA at least partially surrounding the component area CA. For example, each of the component area CA and the main display area MDA may display an image individually or together. The peripheral area DPA may be a non-display area in which display elements are not arranged. The display area DA may be at least partially surrounded by the peripheral area DPA.

In an embodiment, FIG. 1 illustrates that one component area CA is located inside the main display area MDA. In an embodiment, the display apparatus 1 may include two or more component areas CA, and the shapes and sizes of component areas CA may be different from each other. When viewed in a direction substantially perpendicular to the top surface of the display apparatus 1, the component area CA may have various shapes such as circular shapes, elliptical shapes, polygonal shapes such as tetragonal shapes, star shapes, or diamond shapes. Also, FIG. 1 illustrates that the component area CA is arranged at the upper center (in the positive y direction) of the main display area MDA having a substantially rectangular shape when viewed in a direction substantially perpendicular to the top surface of the display apparatus 1. However, the component area CA may be arranged at one side of the main display area MDA having a rectangular shape, for example, at the upper right side or the upper left side thereof.

A plurality of main subpixels Pm may be arranged in the main display area MDA, and a plurality of auxiliary subpixels Pa may be arranged in the component area CA. The display apparatus 1 may provide an image by using a plurality of main subpixels Pm arranged in the main display area MDA and a plurality of auxiliary subpixels Pa arranged in the component area CA.

As described below with reference to FIG. 2, in the component area CA, a component 40 as an electronic element may be arranged under a display panel 10 (see FIG. 2) corresponding to the component area CA. The component 40 (see FIG. 2) may include an imaging element as a camera using infrared light or visible light. Alternatively, the component 40 may include a solar cell, a flash, an illuminance sensor, a proximity sensor, or an iris sensor. Alternatively, the component 40 may have a function of receiving sound. In order to minimize the limitation of the function of the component 40, the component area CA may include a transmission area TA that may transmit light and/or sound that is output from the component 40 to the outside or propagates toward the component 40 from the outside. In an embodiment, when light is transmitted through the component area CA, the light transmittance thereof may be about 10% or more, for example, about 40% or more, about 25% or more, about 50% or more, about 85% or more, or about 90% or more.

A plurality of auxiliary subpixels Pa may be arranged in the component area CA. The plurality of auxiliary subpixels Pa may provide a certain image by emitting light. The image displayed in the component area CA may be an auxiliary image and may have a lower resolution than the image displayed in the main display area MDA. For example, the component area CA may include a transmission area TA through which light and sound may be transmitted, and when no subpixel is arranged over the transmission area TA, the number of auxiliary subpixels Pa, which are arranged per unit area therein, may be less than the number of main subpixels Pm arranged per unit area in the main display area MDA.

Figure 2:
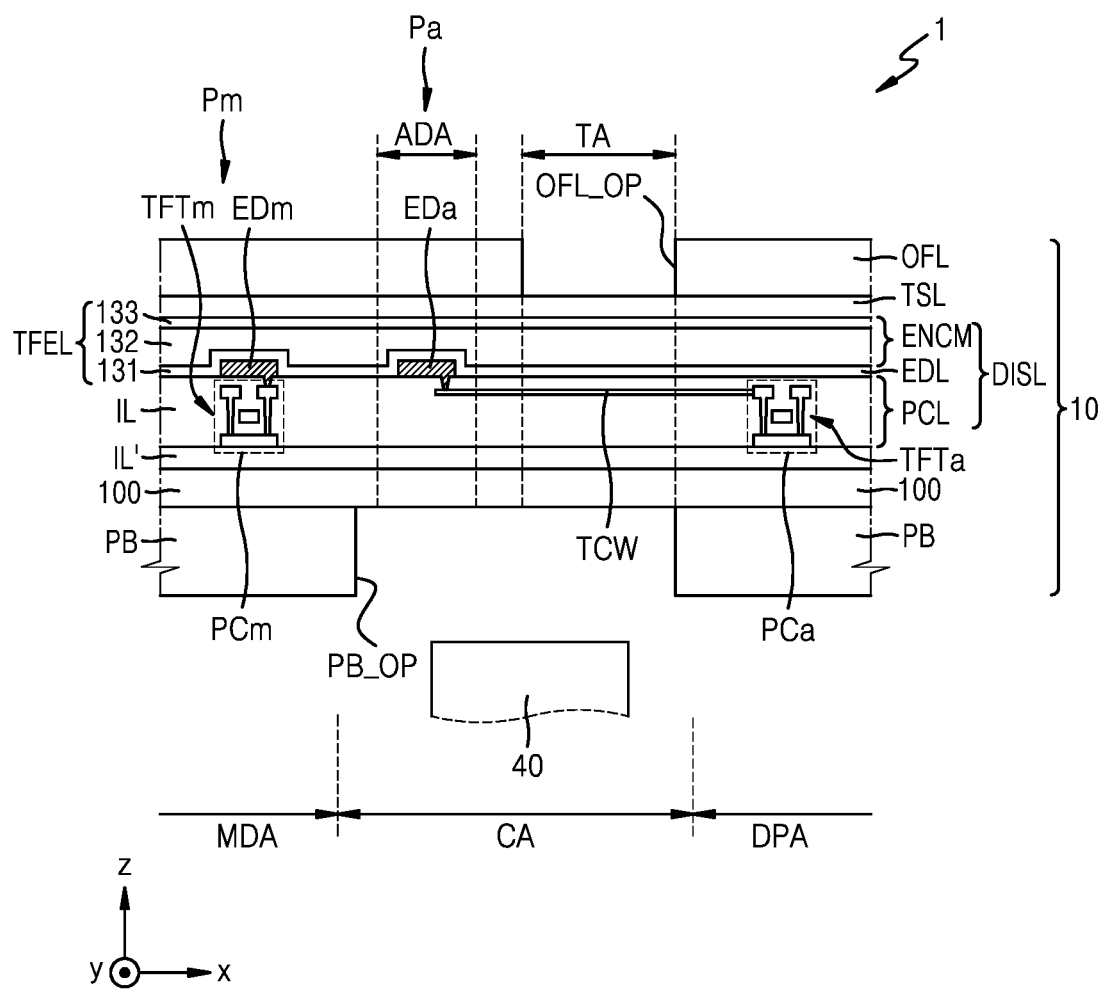
FIGS. 2 and 3 are cross-sectional views schematically illustrating embodiments of a portion of the display apparatus of FIG. 1.
Figure 3:
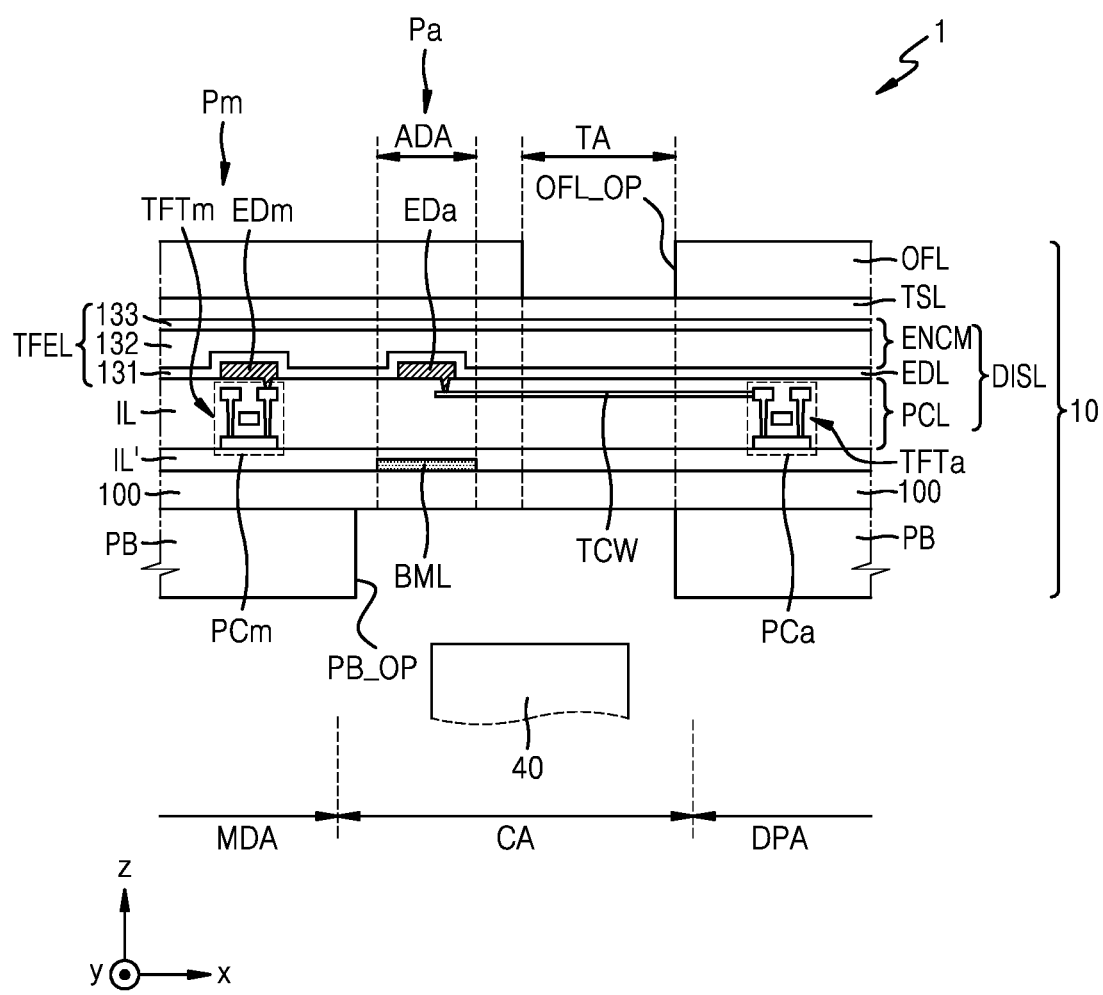

FIGS. 2 and 3 are cross-sectional views schematically illustrating a portion of a display apparatus according to an embodiment.

Referring to FIG. 2, a display apparatus 1 may include a display panel 10 and a component 40 overlapping the display panel 10. A cover window for protecting the display panel 10 may be further arranged over the display panel 10.

The display panel 10 may include a component area CA overlapping the component 40 and a main display area MDA where a main image is displayed. The display panel 10 may include a substrate 100, a display layer DISL over the substrate 100, a touch screen layer TSL, an optical functional layer OFL, and a panel protection member PB arranged under the substrate 100.

The display layer DISL may include a circuit layer PCL including thin film transistors TFTm and TFTa, a display element layer EDL including light emitting elements EDm and EDa as display elements, and a thin film encapsulation layer TFEL or an encapsulation member ENCM such as an encapsulation substrate. Insulating layers IL and IL' may be arranged in the display layer DISL and between the substrate 100 and the display layer DISL.

The substrate 100 may include an insulating material such as glass, quartz, or polymer resin. The substrate 100 may include a rigid substrate or a flexible substrate capable of bending, folding, rolling, or the like.

A main pixel circuit PCm and a main light emitting element EDm connected thereto may be arranged in the main display area MDA of the display panel 10. The main pixel circuit PCm may include at least one main thin film transistor TFTm and may control light emission of the main light emitting element EDm. A main subpixel Pm may be implemented by light emission of the main light emitting element EDm.

An auxiliary light emitting element EDa may be arranged in the component area CA of the display panel 10 to implement an auxiliary subpixel Pa. In an embodiment, an auxiliary pixel circuit PCa for driving the auxiliary light emitting element EDa may not be arranged in the component area CA but may be arranged in a peripheral area DPA that is a non-display area. In an embodiment, the auxiliary pixel circuit PCa may be arranged in a portion of the main display area MDA or may be arranged between the main display area MDA and the component area CA. For example, the auxiliary pixel circuit PCa may be arranged not to overlap the auxiliary light emitting element EDa.

The auxiliary pixel circuit PCa may include at least one auxiliary thin film transistor TFTa and may be electrically connected to the auxiliary light emitting element EDa through a transparent connection line TCW. The transparent connection line TCW may include a transparent conductive material. The auxiliary pixel circuit PCa may control light emission of the auxiliary light emitting element EDa. The auxiliary subpixel Pa may be implemented by light emission of the auxiliary light emitting element EDa. An area of the component area CA in which the auxiliary light emitting element EDa is arranged may be referred to as an auxiliary display area ADA.

Also, an area of the component area CA, in which the auxiliary light emitting element EDa as a display element is not arranged, may be referred to as a transmission area TA. The transmission area TA may be an area through which the light/signal output from the component 40 or the light/signal input to the component 40 arranged corresponding to the component area CA is transmitted. The auxiliary display area ADA and the transmission area TA may be alternately arranged in the component area CA. The transparent connection line TCW connecting the auxiliary pixel circuit PCa to the auxiliary light emitting element EDa may be arranged in the transmission area TA. As the transparent connection line TCW may include a transparent conductive material having high transmittance, the transmittance of the transmission area TA may be secured even when the transparent connection line TCW is arranged in the transmission area TA.

In an embodiment, as the auxiliary pixel circuit PCa is not arranged in the component area CA, the wider transmission area TA may be secured and thus the light transmittance of the display apparatus 1 (e.g., the component area CA) may be further improved.

The display element layer EDL may be covered by the thin film encapsulation layer TFEL or the encapsulation substrate. In an embodiment, the thin film encapsulation layer TFEL may include at least one inorganic layer and at least one organic layer as illustrated in FIG. 2. In an embodiment, the thin film encapsulation layer TFEL may include a first inorganic layer 131, a second inorganic layer 133, and an organic layer 132 therebetween.

The first inorganic layer 131 and the second inorganic layer 133 may include one or more inorganic insulating materials such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide (HfO$_2$), or zinc oxide (ZnO) and may be formed by chemical vapor deposition (CVD) or the like. The organic layer 132 may include a polymer-based material. The polymer-based material may include silicon-based resin, acryl-based resin, epoxy-based resin, polyimide, polyethylene, or the like.

The first inorganic layer 131, the organic layer 132, and the second inorganic layer 133 may be integrally formed to cover the main display area MDA and the component area CA.

When the display element layer EDL is encapsulated by an encapsulation substrate, the encapsulation substrate may be arranged to face the substrate 100 with the display element layer EDL therebetween. A gap may be between the encapsulation substrate and the display element layer EDL. The encapsulation substrate may include glass. A sealant including frit or the like may be arranged between the substrate 100 and the encapsulation substrate, and the sealant may be arranged in the peripheral area DPA described above. The sealant arranged in the peripheral area DPA may surround the display area DA to prevent moisture from penetrating through the side surface thereof.

The touch screen layer TSL may be configured to obtain coordinate information of an external input, for example, a touch event. The touch screen layer TSL may include a touch electrode and touch lines connected to the touch electrode. The touch screen layer TSL may sense an external input by using a self capacitance method or a mutual capacitance method.

The touch screen layer TSL may be formed over the thin film encapsulation layer TFEL. Alternatively, the touch screen layer TSL may be separately formed over a touch substrate and then coupled onto the thin film encapsulation layer TFEL through an adhesive layer such as an optical clear adhesive (OCA). In an embodiment, the touch screen layer TSL may be disposed directly on the thin film encapsulation layer TFEL, and in this case, an adhesive layer may not be disposed between the touch screen layer TSL and the thin film encapsulation layer TFEL.

The optical functional layer OFL may include an anti-reflection layer. The anti-reflection layer may be configured to reduce the reflectance of light (e.g., external light) incident from the outside toward the display apparatus 1.

In an embodiment, the optical functional layer OFL may include a polarization film. The optical functional layer OFL may include an opening OFL_OP corresponding to the transmission area TA. Accordingly, the light transmittance of the transmission area TA may be significantly improved. The opening OFL_OP may be filled with a transparent material such as optically clear resin (OCR). In an embodiment, the optical functional layer OFL may be provided as a filter plate including a black matrix and color filters.

The panel protection member PB may be attached under the substrate 100 to support and protect the substrate 100. The panel protection member PB may include an opening PB_OP corresponding to the component area CA. As the panel protection member PB includes the opening PB_OP, the light transmittance of the component area CA may be improved. The panel protection member PB may include polyethylene terephthalate (PET) or polyimide (PI).

The area of the component area CA may be greater than the area where the component 40 is arranged. Accordingly, the area of the opening PB_OP included in the panel protection member PB may not match the area of the component area CA.

Also, a plurality of components 40 may be arranged in the component area CA. The plurality of components 40 may have different functions. For example, the plurality of components 40 may include at least two of a camera (e.g., imaging element), a solar cell, a flash, a proximity sensor, an illuminance sensor, and an iris sensor.

In FIG. 2A, a bottom metal layer BML is not arranged under the auxiliary light emitting element EDa of the component area CA. However, in an embodiment, the display apparatus 1 may include a bottom metal layer BML as illustrated in FIG. 3.

The bottom metal layer BML may be arranged between the substrate 100 and the auxiliary light emitting element EDa to overlap the auxiliary light emitting element EDa. The bottom metal layer BML may block the external light from reaching the auxiliary light emitting element EDa. Moreover, the bottom metal layer BML may be formed to correspond to the entire component area CA and may be provided to include a lower hole corresponding to the transmission area TA. In this case, the lower hole may be provided in various shapes such as polygonal, circular, or atypical shapes to control the diffraction characteristics of external light.

Figure 4:
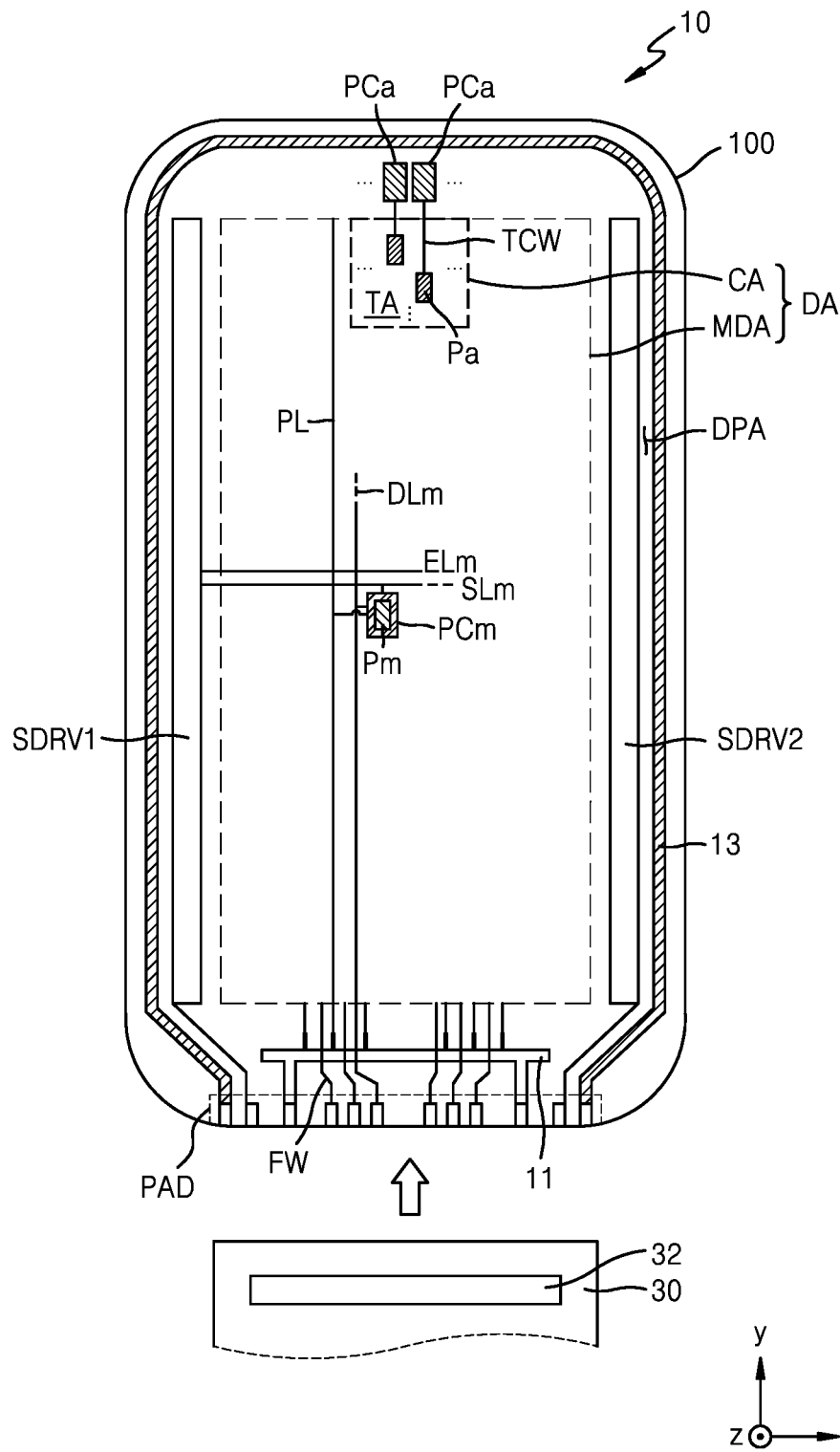
FIGS. 4 and 5 are plan views schematically illustrating embodiments of a display panel of the display apparatus of FIG. 1.
Figure 5:
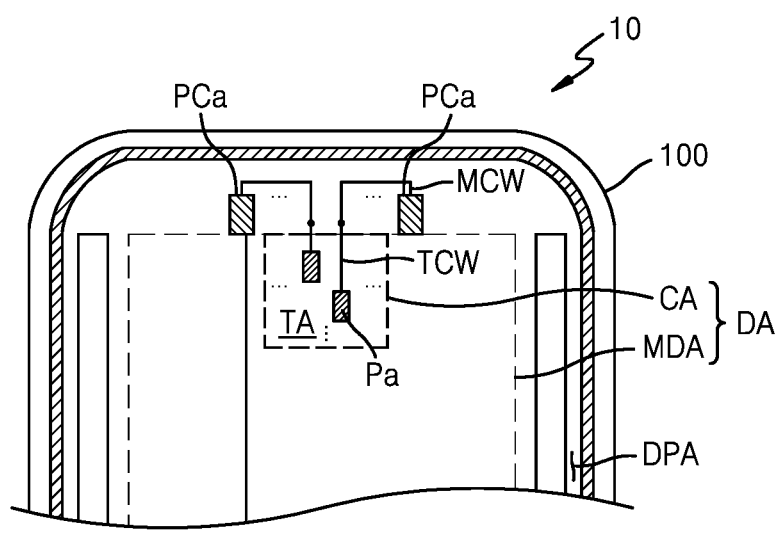

FIGS. 4 and 5 are plan views schematically illustrating a display panel that may be included in the display apparatus of FIG. 1.

Referring to FIG. 4, various elements constituting a display panel 10 may be arranged over a substrate 100. The substrate 100 may include a display area DA and a peripheral area DPA at least partially surrounding the display area DA. The display area DA may include a main display area MDA in which a main image is displayed, and a component area CA which includes a transmission area TA and in which an auxiliary image is displayed. The auxiliary image may form an entire image together with the main image, and the auxiliary image may be an image independent from the main image.

A plurality of main subpixels Pm may be arranged in the main display area MDA. Each of the main subpixels Pm may be implemented by a display element such as an organic light emitting diode (OLED). A main pixel circuit PCm for driving the main subpixel Pm may be arranged in the main display area MDA, and the main pixel circuit PCm may be arranged to overlap the main subpixel Pm. Each main subpixel Pm may emit, for example, red, green, blue, or white light. The main display area MDA may be covered with an encapsulation member to be protected from external air or moisture.

The component area CA may be located on one side of the main display area MDA as described above or may be arranged inside the display area DA and at least partially surrounded by the main display area MDA. A plurality of auxiliary subpixels Pa may be arranged in the component area CA. Each of the plurality of auxiliary subpixels Pa may be implemented by a display element such as an organic light emitting diode. An auxiliary pixel circuit PCa for driving the auxiliary subpixel Pa may be arranged in the peripheral area DPA close to the component area CA. For example, when the component area CA is arranged on an upper side of the display area DA, the auxiliary pixel circuit PCa may be arranged in the peripheral area DPA located on an upper side of the display apparatus 1. The auxiliary pixel circuit PCa and the display element implementing the auxiliary subpixel Pa may be connected by a transparent connection line TCW extending in the y direction.

Each auxiliary subpixel Pa may emit, for example, red, green, blue, or white light. The component area CA may be covered with an encapsulation member to be protected from external air or moisture.

Moreover, the component area CA may include a transmission area TA. The transmission area TA may be arranged to at least partially surround a plurality of auxiliary subpixels Pa. Alternatively, the transmission area TA may be arranged in a grid form with a plurality of auxiliary subpixels Pa.

As the component area CA includes a transmission area TA, the resolution of the component area CA may be lower than the resolution of the main display area MDA. For example, the resolution of the component area CA may be about 1/2, 3/8, 1/3, 1/4, 2/9, 1/8, 1/9, or 1/16 of the resolution of the main display area MDA. For example, the resolution of the main display area MDA may be about 400 ppi or more, and the resolution of the component area CA may be about 200 ppi or about 100 ppi.

Each of the pixel circuits for driving the subpixels Pm and Pa may be electrically connected to the peripheral circuits arranged in the peripheral area DPA. A first scan driving circuit SDRV1, a second scan driving circuit SDRV2, a terminal portion PAD, a driving voltage supply line 11, and a common voltage supply line 13 may be arranged in the peripheral area DPA.

The first scan driving circuit SDRV1 may apply a scan signal to each of the main pixel circuits PCm for driving the main subpixels Pm, through a main scan line SLm. The first scan driving circuit SDRV1 may apply an emission control signal to each pixel circuit through a main emission control line ELm. The second scan driving circuit SDRV2 may be located on the opposite side of the first scan driving circuit SDRV1 with respect to the main display area MDA and may substantially parallel the first scan driving circuit SDRV1. Some of the main pixel circuits of the main subpixels Pm of the main display area MDA may be electrically connected to the first scan driving circuit SDRV1, and the others of the main pixel circuits PCm of the main subpixels Pm of the main display area MDA may be electrically connected to the second scan driving circuit SDRV2.

The terminal portion PAD may be arranged at one side of the substrate 100. The terminal portion PAD may be exposed to be connected to a display circuit board 30 by not being covered by an insulating layer. A display driver 32 may be arranged at the display circuit board 30.

The display driver 32 may generate a control signal to be transmitted to the first scan driving circuit SDRV1 and the second scan driving circuit SDRV2. The display driver 32 may generate a data signal, and the generated data signal may be transmitted to the main pixel circuits PCm through a fan-out line FW and a main data line DL connected to the fan-out line FW.

The display driver 32 may supply a driving voltage ELVDD to the driving voltage supply line 11 and may supply a common voltage ELVSS to the common voltage supply line 13. The driving voltage ELVDD may be applied to the pixel circuits of the subpixels Pm and Pa through the driving voltage line PL connected to the driving voltage supply line 11, and the common voltage ELVSS may be connected to the common voltage supply line 13 to be applied to an opposite electrode of the display element.

The driving voltage supply line 11 may be provided to extend in the x direction under the main display area MDA. The common voltage supply line 13 may have a shape in which one side is open in a loop shape, to partially surround the main display area MDA.

Although FIG. 4 illustrates a case where there is one component area CA, a plurality of component areas CA may be provided. In this case, a plurality of component areas CA may be arranged to be spaced apart from each other, a first camera may be arranged corresponding to a component area CA, and a second camera may be arranged corresponding to another component area CA. Alternatively, a camera may be arranged corresponding to a component area CA, and an infrared sensor may be arranged corresponding to another component area CA. The shapes and sizes of the plurality of component areas CA may be different from each other.

Moreover, the component area CA may have a circular, elliptical, polygonal, or atypical shape. In an embodiment, the component area CA may have an octagonal shape. The component area CA may have any polygonal shape such as a tetragonal shape or a hexagonal shape. The component area CA may be at least partially surrounded by the main display area MDA.

Also, in FIG. 4, the auxiliary pixel circuit PCa is arranged adjacent to the outer side of the component area CA. However, embodiments are not limited thereto. As illustrated in FIG. 5, the auxiliary pixel circuit PCa may be arranged adjacent to the outer side of the main display area MDA. In an embodiment, the transparent connection line TCW may be connected to the auxiliary pixel circuit PCa through a metal connection line MCW. The transparent connection line TCW may be arranged in the transmission area TA. The transparent connection line TCW may be arranged in the component area CA, and at least a portion of the transparent connection line TCW may extend to the peripheral area DPA. The metal connection line MCW may be arranged in the peripheral area DPA. The transparent connection line TCW may include a transparent conductive material, and the metal connection line MCW may include a metal having high conductivity. In an embodiment, the metal connection line MCW and the transparent connection line TCW may be arranged on the same layer. In an embodiment, the metal connection line MCW and the transparent connection line TCW may be arranged on different layers, and may be connected to each other through a contact hole.

Figure 6:
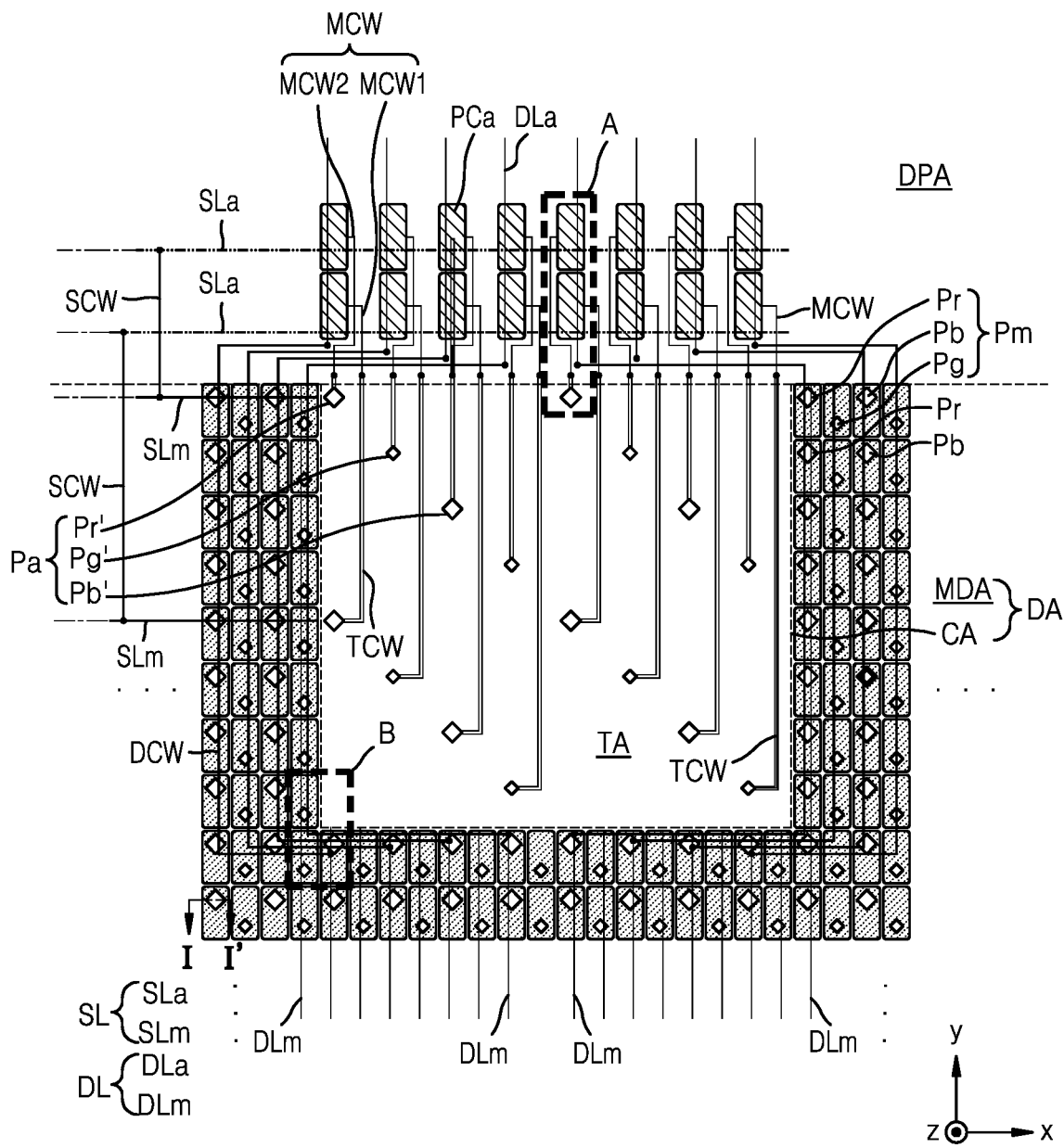
FIG. 6 is a plan view schematically illustrating a portion of the display apparatus of FIG. 1.

FIG. 6 is a plan view schematically illustrating a display apparatus according to an embodiment. For example, FIG. 6 illustrates a portion of a component area CA, a main display area MDA therearound, and a peripheral area DPA.

Referring to FIG. 6, a plurality of main subpixels Pm may be arranged in the main display area MDA. Herein, a subpixel may refer to as an emission area that emits light by a display element as a minimum unit for displaying an image. Moreover, when an organic light emitting diode is used as a display element, the emission area may be defined by an opening of a pixel definition layer. This will be described below. Each of the plurality of main subpixels Pm may emit any one of red, green, blue, and white light.

In an embodiment, the main subpixels Pm arranged in the main display area MDA may include a first subpixel Pr, a second subpixel Pg, and a third subpixel Pb. The first subpixel Pr, the second subpixel Pg, and the third subpixel Pb may respectively implement red, green, and blue colors. The main subpixels Pm may be arranged in a pentile structure.

For example, the first subpixels Pr may be arranged at the first and third vertexes facing each other among the vertexes of a virtual square having a central point of the second subpixel Pg as a central point thereof and the third subpixels Pb may be arranged at the second and fourth vertexes that are the other vertexes thereof. The size of the second subpixel Pg may be less than the sizes of the first subpixel Pr and the third subpixel Pb.

Such a pixel arrangement structure may be referred to as a pentile matrix structure or a pentile structure, and high resolution may be implemented by a small number of pixels by applying a rendering drive that represents colors by sharing adjacent pixels.

Although FIG. 6 illustrates that a plurality of main subpixels Pm are arranged in a pentile matrix structure, embodiments are not limited thereto. For example, a plurality of main subpixels Pm may be arranged in various forms such as a stripe structure, a mosaic arrangement structure, and a delta arrangement structure.

In the main display area MDA, main pixel circuits PCm (see FIG. 4) may be arranged to overlap the main subpixels Pm, and the main pixel circuits PCm may be arranged in a matrix form in the x and y directions. Herein, a main pixel circuit PCm may refer to a unit of a pixel circuit that implements one main subpixel Pm.

A plurality of auxiliary subpixels Pa may be arranged in the component area CA. Each of the plurality of auxiliary subpixels Pa may emit any one of red, green, blue, and white light. The auxiliary subpixels Pa may include a first auxiliary subpixel Pr', a second auxiliary subpixel Pg', and a third auxiliary subpixel Pb' that emit different colors. The first auxiliary subpixel Pr', the second auxiliary subpixel Pg', and the third auxiliary subpixel Pb' may respectively display red, green, and blue colors.

The number per unit area of the auxiliary subpixels Pa arranged in the component area CA may be less than the number per unit area of the main subpixels Pm arranged in the main display area MDA. For example, the number of auxiliary subpixels Pa and the number of main subpixels Pm arranged per the same area may be in the ratio of 1:2, 1:4, 1:8, or 1:9. For example, the resolution of the component area CA may be 1/2, 1/4, 1/8, or 1/9 of the resolution of the main display area MDA. FIG. 6 illustrates a case where the resolution of the component area CA is 1/8 of the resolution of the main display area MDA.

The auxiliary subpixels Pa arranged in the component area CA may be arranged in various forms. Some auxiliary subpixels Pa among the auxiliary subpixels Pa may be collected to form a pixel group and may be arranged in various forms such as a pentile structure, a stripe structure, a mosaic arrangement structure, or a delta arrangement structure in the pixel group. In this case, the distance between the auxiliary subpixels Pa arranged in the pixel group may be equal to the distance between the main subpixels Pm.

Alternatively, as illustrated in FIG. 6, the auxiliary subpixels Pa may be distributed and arranged in the component area CA. For example, the distance between the auxiliary subpixels Pa may be greater than the distance between the main subpixels Pm. Moreover, an area in which the auxiliary subpixels Pa are not arranged in the component area CA may be referred to as a transmission area TA having high light transmittance.

The auxiliary pixel circuits PCa for controlling light emission of the auxiliary subpixels Pa may be arranged in the peripheral area DPA. As the auxiliary pixel circuits PCa are not arranged in the component area CA, the component area CA may secure the wider transmission area TA. Also, as lines for applying a constant voltage and signals to the auxiliary pixel circuit PCa are not arranged in the component area CA, the auxiliary subpixels Pa may be freely arranged without considering the arrangement of the lines.

The auxiliary pixel circuits PCa may be connected to the auxiliary subpixels Pa by metal connection lines MCW and transparent connection lines TCW. In an embodiment, the metal connection line MCW and the transparent connection line TCW may be electrically connected by a connection line CW (see FIG. 8).

The transparent connection line TCW may be at least partially arranged in the component area CA and may include a transparent conductive material. For example, the transparent connection line TCW may include a transparent conductive oxide (TCO). The transparent connection line TCW may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the transparent connection line TCW may be arranged in the component area CA and may partially extend to the peripheral area DPA.

When the transparent connection line TCW is connected to the auxiliary subpixel Pa, it may mean that the transparent connection line TCW is electrically connected to an auxiliary pixel electrode of an auxiliary display element implementing the auxiliary subpixel Pa.

The transparent connection line TCW may be connected to the auxiliary pixel circuit PCa through the metal connection line MCW. The metal connection line MCW may be arranged in the peripheral area DPA and connected to the auxiliary pixel circuit PCa.

The metal connection line MCW may include a conductive material including molybdenum (Mo), aluminum (Al), copper (Cu), titanium (Ti), or the like and may include a single layer or multiple layers including the above material. The metal connection line MCW may be provided as a plurality of metal connection lines MCW between the auxiliary pixel circuits PCa.

In an embodiment, the metal connection line MCW may include a first metal connection line MCW1 and a second metal connection line MCW2 that are arranged on different layers. For example, the first metal connection line MCW1 and the source electrode S1 may be arranged on the same layer, and may include the same material. The second metal connection line MCW2 may be arranged with respect to the first metal connection line MCW1 with an insulating layer therebetween. For example, the second metal connection line MCW2 and a main pixel electrode 121*m* of a main organic light emitting diode OLEDm (see FIG. 7) may be arranged on the same layer and may include the same material. Alternatively, the second metal connection line MCW2 and a main connection electrode CMm (see FIG. 7) may include the same material and may be arranged on the same layer.

The first metal connection line MCW1 and the second metal connection line MCW2 may be arranged between the auxiliary pixel circuits PCa and may be at least partially curved in a plan view. In an embodiment, the first metal connection line MCW1 and the second metal connection line MCW2 arranged on different layers may be provided as a plurality of first metal connection lines MCW1 and a plurality of second metal connection lines MCW2, and the first metal connection line MCW1 and the second metal connection line MCW2 may be alternately arranged in an area between a plurality of auxiliary pixel circuits PCa.

The transparent connection line TCW may be arranged in the component area CA, and at least a portion of the transparent connection line TCW may extend to the peripheral area DPA. The transparent connection line TCW may be connected to the metal connection line MCW in the peripheral area DPA on the upper side of the component area CA.

The metal connection line MCW and the transparent connection line TCW may be arranged on the same layer or may be arranged on different layers. When the metal connection line MCW and the transparent connection line TCW are arranged on different layers, they may be connected through a contact hole.

The metal connection line MCW may have higher conductivity than the transparent connection line TCW. As the metal connection line MCW is arranged in the peripheral area DPA, the metal connection line MCW may not require high light transmittance. Thus, the metal connection line MCW may include a material having lower light transmittance and higher conductivity than the transparent connection line TCW. Accordingly, the resistance value of the metal connection line MCW may be minimized and reduced.

A scan line SL may include a main scan line SLm connected to the main pixel circuits PCm, and an auxiliary scan line SLa connected to the auxiliary pixel circuits PCa. The main scan line SLm may extend in the x direction and may be connected to the main pixel circuits PCm arranged in the same row. The main scan line SLm may not be arranged in the component area CA. For example, the main scan line SLm may be disconnected with the component area CA therebetween. In this case, the main scan line SLm arranged on the left side of the component area CA may receive a signal from the first scan driving circuit SDRV1 (see FIG. 4), and the main scan line SLm arranged on the right side of the component area CA may receive a signal from the second scan driving circuit SDRV2 (see FIG. 4).

The auxiliary scan line SLa may be connected to the auxiliary pixel circuits PCa for driving the auxiliary subpixel Pa arranged in the same row, among the auxiliary pixel circuits PCa arranged in the same row.

The main scan line SLm and the auxiliary scan line SLa may be connected by a scan connection line SCW, and thus the same signal may be applied to the pixel circuits for driving the main subpixel Pm and the auxiliary subpixel Pa arranged in the same row.

The scan connection line SCW may be arranged on a different layer than the main scan line SLm and the auxiliary scan line SLa and may be connected to the main scan line SLm and the auxiliary scan line SLa through contact holes, respectively. The scan connection line SCW may be arranged in the main display area MDA, and at least a portion of the scan connection line SCW may extend to the peripheral area DPA.

A data line DL may include a main data line DLm connected to the main pixel circuits PCm and an auxiliary data line DLa connected to the auxiliary pixel circuits PCa. The main data line DLm may extend in the y direction and may be connected to the main pixel circuits PCm arranged in the same column. The auxiliary data line DLa may extend in the y direction and may be connected to the auxiliary pixel circuits PCa arranged in the same column.

The main data line DLm and the auxiliary data line DLa may be arranged to be apart from each other with the component area CA therebetween. The main data line DLm and the auxiliary data line DLa may be connected by a data connection line DCW, and thus the same signal may be applied to the pixel circuits for driving the main subpixel Pm and the auxiliary subpixel Pa arranged in the same row.

The data connection line DCW may be arranged to bypass the component area CA. The data connection line DCW may be arranged to overlap the main pixel circuits PCm arranged in the main display area MDA. As the data connection line DCW is arranged in the main display area MDA, as it is not necessary to secure a separate space in which the data connection line DCW is arranged, a dead-space area may be minimized or reduced.

The data connection line DCW may be arranged on a different layer than a layer, on which the main data line DLm and the auxiliary data line DLa are disposed, and may be connected to the main data line DLm and the auxiliary data line DLa through contact holes, respectively.

Figure 7:
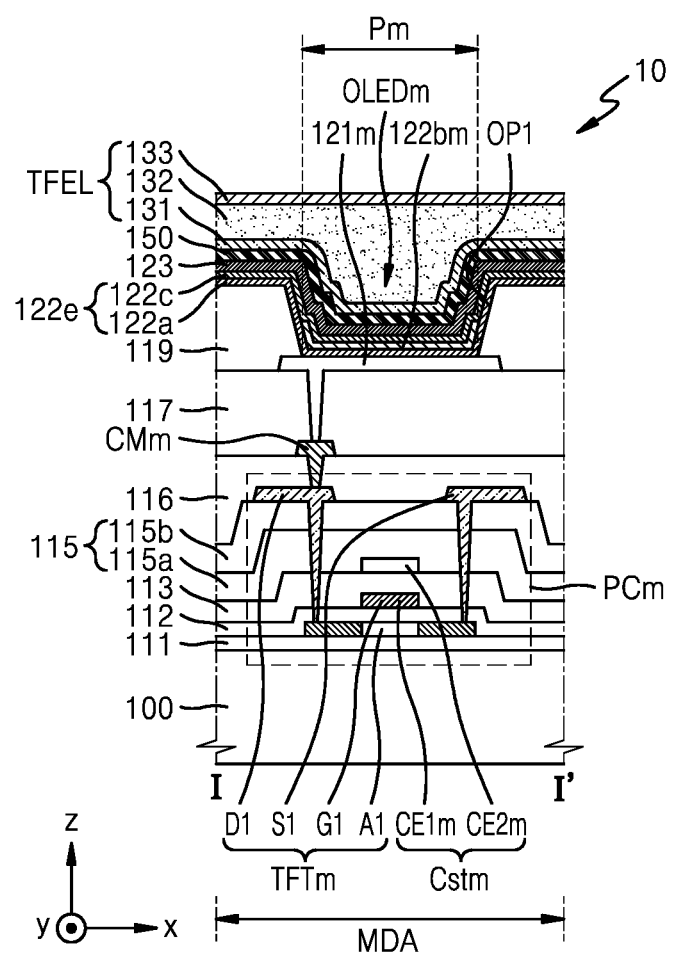
FIG. 7 is a cross-sectional view taken along lines I-I' of FIG. 6.

FIG. 7 is a cross-sectional view schematically illustrating a display apparatus according to an embodiment. For example, FIG. 7 corresponds to a cross-sectional view of the display apparatus taken along line I-I' of FIG. 6, which corresponds to a cross-sectional view of the main subpixel Pm arranged in the main display area MDA.

Referring to FIG. 7, a main subpixel Pm may be arranged in the main display area MDA. A main pixel circuit PCm including a main thin film transistor TFTm and a main storage capacitor Cstm, and a main organic light emitting diode OLEDm as a display element connected to the main pixel circuit PCm may be arranged in the main display area MDA.

Hereinafter, a structure, in which the components included in the display panel 10 are stacked, will be described. The display panel 10 may include a stack of a substrate 100, a buffer layer 111, a main pixel circuit PCm, and a main organic light emitting diode OLEDm.

The substrate 100 may include an insulating material such as glass, quartz, or polymer resin. The substrate 100 may include a rigid substrate or a flexible substrate capable of bending, folding, rolling, or the like.

The buffer layer 111 may be located over the substrate 100 to reduce or block the penetration of foreign materials, moisture, or external air from the bottom of the substrate 100 and may provide a flat surface over the substrate 100. The buffer layer 111 may include an inorganic material such as oxide or nitride, an organic material, or an organic/inorganic composite and may include a single-layer or multiple-layer structure of an inorganic material and an organic material. A barrier layer for blocking the penetration of external air may be further included between the substrate 100 and the buffer layer 111. In an embodiment, the buffer layer 111 may include silicon oxide ($SiO_x$) or silicon nitride ($SiN_x$).

A main thin film transistor TFTm may be arranged over the buffer layer 111. The main thin film transistor TFTm may include a semiconductor layer A1, a gate electrode G1, a source electrode S1, and a drain electrode D1. The main thin film transistor TFTm may be connected to the main organic light emitting diode OLEDm to drive the main organic light emitting diode OLEDm.

In an embodiment, the semiconductor layer A1 may be arranged over the buffer layer 111 and may include polysilicon. In an embodiment, the semiconductor layer A1 may include amorphous silicon. In an embodiment, the semiconductor layer A1 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer A1 may include a channel area, and a source area and a drain area that are doped with dopants.

A first gate insulating layer 112 may be arranged over the semiconductor layer A1. The first gate insulating layer 112 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The first gate insulating layer 112 may include a single layer or multiple layers including the above inorganic insulating material.

A gate electrode G1 may be arranged over the first gate insulating layer 112 to overlap the semiconductor layer A1.

The gate electrode G1 may include molybdenum (Mo), aluminum (Al), copper (Cu), titanium (Ti), or the like and may include a single layer or multiple layers. In an embodiment, the gate electrode G1 may include a single layer of molybdenum (Mo).

A second gate insulating layer 113 may be formed over the gate electrode G1. The second gate insulating layer 113 may include an inorganic insulating material such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide (ZnO). The second gate insulating layer 113 may include a single layer or multiple layers including the above inorganic insulating material.

A main upper electrode CE2m of the main storage capacitor Cstm may be arranged over the second gate insulating layer 113. In the main display area MDA, the main upper electrode CE2m of the main storage capacitor Cstm may overlap the gate electrode G1 arranged thereunder.

The gate electrode G1 and the main upper electrode CE2m overlapping each other with the second gate insulating layer 113 therebetween may constitute the main storage capacitor Cstm. In an embodiment, the gate electrode G1 may be a main lower electrode CE1m of the main storage capacitor Cstm. In an embodiment, the gate electrode G1 may be provided as an independent element spaced apart from the main lower electrode CE1m of the main storage capacitor Cstm.

The main upper electrode CE2m may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or multiple layers of the above material.

An interlayer insulating layer 115 may be arranged to cover the main upper electrode CE2m. The interlayer insulating layer 115 may include silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide (ZnO).

In an embodiment, the interlayer insulating layer 115 may include a first insulating layer 115a and a second insulating layer 115b. In an embodiment, the second insulating layer 115b may be disposed directly on the first insulating layer 115a. In an embodiment, the first insulating layer 115a and the second insulating layer 115b may include the same material. For example, the first insulating layer 115a and the second insulating layer 115b may include silicon oxide ($SiO_X$) or may include silicon nitride ($SiN_X$). In an embodiment, the first insulating layer 115a and the second insulating layer 115b may include different materials. For example, the first insulating layer 115a may include silicon oxide ($SiO_X$), and the second insulating layer 115b may include silicon nitride ($SiN_X$). Alternatively, the first insulating layer 115a may include silicon nitride ($SiN_X$), and the second insulating layer 115b may include silicon oxide ($SiO_X$).

A source electrode S1 and a drain electrode D1 may be arranged over the interlayer insulating layer 115. The source electrode S1 and the drain electrode D1 may include a conductive material including molybdenum (Mo), aluminum (Al), copper (Cu), titanium (Ti), or the like and may include a single layer or multiple layers including the above material. In an embodiment, the source electrode S1 and the drain electrode D1 may include a multilayer structure of Ti/Al/Ti.

A first organic insulating layer 116 may be arranged over the source electrode S1 and the drain electrode D1. The first organic insulating layer 116 may include a general-purpose polymer such as photosensitive polyimide, polyimide, polystyrene (PS), polycarbonate (PC), benzocyclobutene (BCB), hexamethyldisiloxane (HMDSO), or polymethylmethacrylate (PMMA), a polymer derivative having a phenolic group, an acrylic polymer, an imide-based polymer, an arylether-based polymer, an amide-based polymer, a fluorine-based polymer, a p-xylene-based polymer, or a vinyl alcohol-based polymer. Alternatively, the first organic insulating layer 116 may include a siloxane-based organic material. The siloxane-based organic material may include hexamethyldisiloxane, octamethyltrisiloxane, decamethyltetrasiloxane, dodecamethylpentasiloxane, and polydimethylsiloxane.

A main connection electrode CMm may be arranged over the first organic insulating layer 116. A second organic insulating layer 117 may be arranged over the main connection electrode CMm. The second organic insulating layer 117 may have a flat upper surface such that the main pixel electrode 121m arranged thereover may be formed to be flat. The second organic insulating layer 117 may include a siloxane-based organic material having high light transmittance and high flatness. The siloxane-based organic material may include hexamethyldisiloxane, octamethyltrisiloxane, decamethyltetrasiloxane, dodecamethylpentasiloxane, and polydimethylsiloxane. Alternatively, the second organic insulating layer 117 may include a general-purpose polymer such as photosensitive polyimide, polyimide, benzocyclobutene (BCB), hexamethyldisiloxane (HMDSO), polymethylmethacrylate (PMMA), or polystyrene (PS), a polymer derivative having a phenolic group, an acrylic polymer, an imide-based polymer, an arylether-based polymer, an amide-based polymer, a fluorine-based polymer, a p-xylene-based polymer, or a vinyl alcohol-based polymer.

A main organic light emitting diode OLEDm may be arranged over the second organic insulating layer 117. The main organic light emitting diode OLEDm may include a main pixel electrode 121m, a main emission layer 122bm, and an opposite electrode 123. The main pixel electrode 121m of the main organic light emitting diode OLEDm may be electrically connected to the main pixel circuit PCm through the main connection electrode CMm arranged over the first organic insulating layer 116.

The main pixel electrode 121m may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The main pixel electrode 121m may include a reflection layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. For example, the main pixel electrode 121m may have a structure including layers formed of ITO, IZO, ZnO, or 111203 over/under the reflection layer. In this case, the main pixel electrode 121m may have a stack structure of ITO/Ag/ITO.

A pixel definition layer 119 may cover the edge of the main pixel electrode 121m over the second organic insulating layer 117 and may include a first opening OP1 exposing at least a portion of the main pixel electrode 121m. The emission area of the main organic light emitting diode OLEDm, for example, the size and shape of the main subpixel Pm, may be defined by the first opening OP1.

The pixel definition layer 119 may increase the distance between the edge of the main pixel electrode 121m and the opposite electrode 123 over the main pixel electrode 121m to prevent an arc or the like from occurring at the edge of the main pixel electrode 121m. The pixel definition layer 119 may be formed of an organic insulating material such as polyimide, polyamide, acrylic resin, benzocyclobutene, hexamethyldisiloxane (HMDSO), or phenol resin by spin coating or the like.

A main emission layer 122bm formed to correspond to the main pixel electrode 121m may be arranged inside the first opening OP1 of the pixel definition layer 119. The main emission layer 122bm may include a high molecular weight material or a low molecular weight material and may emit red, green, blue, or white light.

An organic functional layer 122e may be arranged over and/or under the main emission layer 122bm. The organic functional layer 122e may include a first functional layer 122a and/or a second functional layer 122c. For example, the first functional layer 122a and/or the second functional layer 122c may be omitted.

The first functional layer 122a may be arranged under the main emission layer 122bm. The first functional layer 122a may include a single layer or multiple layers including an organic material. The first functional layer 122a may include a hole transport layer (HTL) having a single-layer structure. Alternatively, the first functional layer 122a may include a hole injection layer (HIL) and a hole transport layer (HTL). The first functional layer 122a may be integrally formed over the entire surface of the display panel 10.

The second functional layer 122c may be arranged over the main emission layer 122bm. The second functional layer 122c may include a single layer or multiple layers including an organic material. The second functional layer 122c may include an electron transport layer (ETL) and/or an electron injection layer (EIL). The second functional layer 122c may be integrally formed over the entire surface of the display panel 10.

An opposite electrode 123 may be arranged over the second functional layer 122c. The opposite electrode 123 may include a conductive material having a low work function. For example, the opposite electrode 123 may include a transparent layer or a semi-transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 123 may further include a layer such as ITO, IZO, ZnO, or $In_2O_3$ over the transparent layer or the semi-transparent layer including the above material. The opposite electrode 123 may be integrally formed over the entire surface of the display panel 10.

The layers from the main pixel electrode 121m to the opposite electrode 123 formed in the main display area MDA may constitute the main organic light emitting diode OLEDm.

A top layer 150 including an organic material may be arranged over the opposite electrode 123. The top layer 150 may be provided to protect the opposite electrode 123 and simultaneously improve or increase light extraction efficiency. The top layer 150 may include an organic material having a higher refractive index than the opposite electrode 123. Alternatively, the top layer 150 may include a stack of layers having different refractive indexes. For example, the top layer 150 may include a stack of a high refractive index layer/a low refractive index layer/a high refractive index layer. In this case, the refractive index of the high refractive index layer may be about 1.7 or more, and the refractive index of the low refractive index layer may be about 1.3 or less.

The top layer 150 may further include LiF. Alternatively, the top layer 150 may further include an inorganic insulating material such as silicon oxide ($SiO_x$) or silicon nitride ($SiN_x$).

A thin film encapsulation layer TFEL may be arranged over the top layer 150, and the main organic light emitting diode OLEDm may be encapsulated by the thin film encapsulation layer TFEL. The thin film encapsulation layer TFEL may prevent external moisture or foreign substances from penetrating into the main organic light emitting diode OLEDm. The thin film encapsulation layer TFEL may include a first inorganic layer 131, an organic layer 132, and a second inorganic layer 133.

Figure 8:
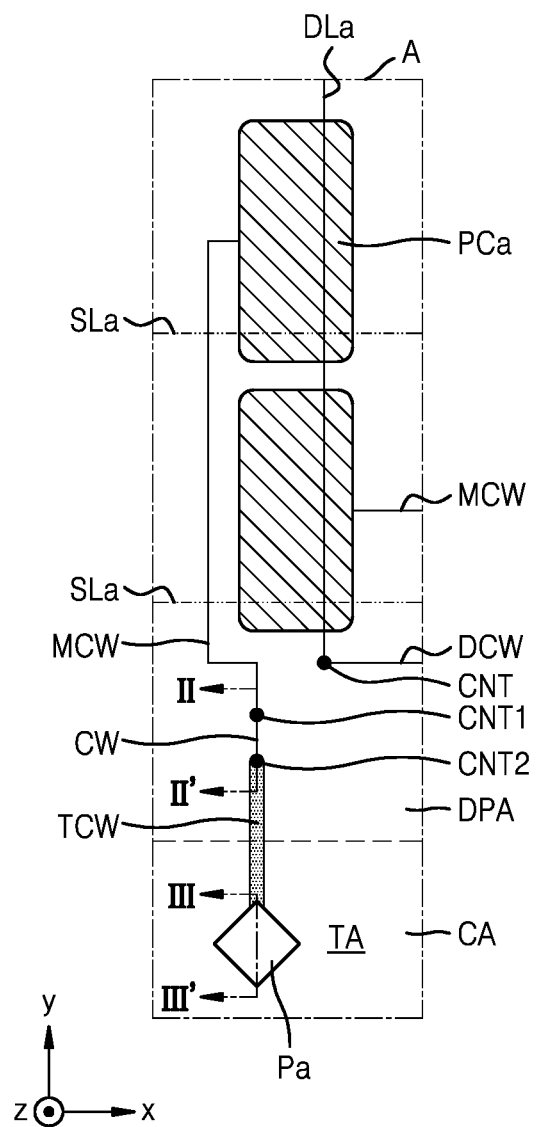
FIG. 8 is an enlarged view of region A of FIG. 6 illustrating an example of a component area and a peripheral area of the display panel of the display apparatus of FIG. 1.
Figure 9:
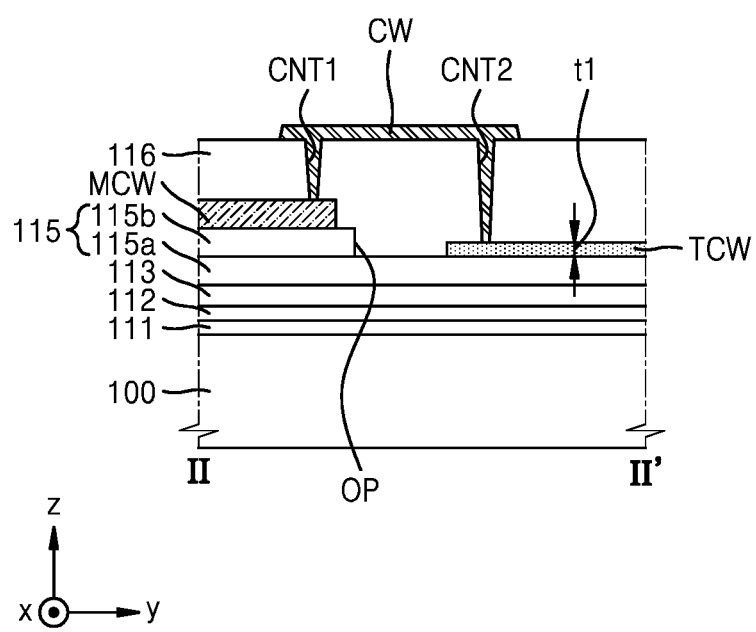
FIG. 9 is a cross-sectional view taken along lines II-IF of FIG. 8 illustrating an example of a metal connection line and a transparent connection line of the display panel of the display apparatus of FIG. 1.

FIG. 8 is a plan view schematically illustrating a display apparatus according to an embodiment, and FIG. 9 is a cross-sectional view schematically illustrating a display apparatus according to an embodiment. For example, FIG. 8 is an enlarged view of region A of FIG. 6, and FIG. 9 is a cross-sectional view of the display apparatus taken along line of FIG. 8. In FIG. 8, like reference numerals as those in FIG. 6 denote like members, and thus redundant descriptions thereof will be omitted for descriptive convenience.

Referring to FIG. 8, an auxiliary subpixel Pa may be arranged over the component area CA, and an auxiliary pixel circuit PCa for driving the auxiliary subpixel Pa may be arranged over the peripheral area DPA. The auxiliary subpixel Pa and the auxiliary pixel circuit PCa may be electrically connected through a transparent connection line TCW and a metal connection line MCW.

In an embodiment, the transparent connection line TCW may be arranged over the component area CA. The transparent connection line TCW may be arranged over the component area CA, and at least a portion of the transparent connection line TCW may extend to the peripheral area DPA. Thus, at least a portion of the transparent connection line TCW may be arranged over the peripheral area DPA.

In an embodiment, the metal connection line MCW may be arranged over the peripheral area DPA. The metal connection line MCW may be arranged over the peripheral area DPA and electrically connected to the auxiliary pixel circuit PCa.

In an embodiment, the transparent connection line TCW and the metal connection line MCW may be electrically connected to each other. For example, the transparent connection line TCW and the metal connection line MCW may be electrically connected through a connection line CW. In an embodiment, one end of the connection line CW may be electrically connected to the metal connection line MCW through a first contact hole CNT1, and the other end of the connection line CW may be electrically connected to the transparent connection line TCW through a second contact hole CNT2. Accordingly, the auxiliary subpixel Pa and the auxiliary pixel circuit PCa may be electrically connected to each other. This will be described in more detail with reference to FIG. 11.

In an embodiment, an auxiliary data line DLa and a data connection line DCW may be electrically connected through a contact hole CNT.

Referring to FIGS. 8 and 9, a buffer layer 111 may be arranged over the substrate 100, and a first gate insulating layer 112 and a second gate insulating layer 113 may be arranged over the buffer layer 111.

An interlayer insulating layer 115 may be arranged over the second gate insulating layer 113. In an embodiment, an interlayer insulating layer 115 including a first insulating layer 115a and a second insulating layer 115b may be arranged over the second gate insulating layer 113 of the peripheral area DPA. In an embodiment, the second insulating layer 115b may be disposed directly on the first insulating layer 115a. In an embodiment, the first insulating layer 115a and the second insulating layer 115b may include different materials. For example, the first insulating layer 115a may include silicon oxide ($SiO_x$), and the second insulating layer 115b may include silicon nitride ($SiN_x$).

In an embodiment, in the process of patterning a metal layer arranged over the second insulating layer 115b of the interlayer insulating layer 115, at least a portion of the second insulating layer 115b arranged in the component area CA may be removed together, and thus the thickness distribution of the second insulating layer 115b arranged in the component area CA may increase. Also, the transmittance distribution in the component area CA may increase due to the increased thickness distribution.

In an embodiment, the second insulating layer 115b of the interlayer insulating layer 115 arranged over the component area CA may be removed. For example, the second insulating layer 115b of the interlayer insulating layer 115 may be arranged in the main display area MDA and the peripheral area DPA, but the second insulating layer 115b may not be arranged in the component area CA. As the second insulating layer 115b formed in the component area CA is removed, the increase of the transmittance distribution of the component area CA due to the increase of the thickness distribution of the second insulating layer 115b may be prevented or minimized.

In an embodiment, as the second insulating layer 115b is not arranged in the component area CA, the second insulating layer 115b may include an opening OP. At least a portion of the first insulating layer 115a may be exposed through the opening OP formed in the second insulating layer 115b. In an embodiment, the opening OP formed in the second insulating layer 115b may at least partially overlap the component area CA.

In an embodiment, a transparent connection line TCW may be arranged in the opening OP formed in the second insulating layer 115b. In an embodiment, the transparent connection line TCW may have a first thickness t1 in a direction (e.g., z direction) perpendicular the substrate 100. In an embodiment, the first thickness t1 may be about 500 angstroms (Å) to about 2,000 Å. Alternatively, the first thickness t1 may be about 100 Å to about 2,000 Å. When the transparent connection line TCW has a thickness of less than about 100 Å, the resistance of the transparent connection line TCW may increase and thus the driving efficiency of the display apparatus may be degraded or reduced. On the other hand, when the transparent connection line TCW has a thickness of more than about 2,000 Å, as the transmittance of the transparent connection line TCW may decrease, the transmittance of the component area CA may decrease and the transparent connection line TCW may cause diffraction. Thus, as the transparent connection line TCW may have a thickness of about 100 Å to about 2,000 Å, the driving efficiency of the display apparatus may be improved or increased and simultaneously the transmittance of the component area CA may be improved or increased.

However, as the second insulating layer 115b arranged in the main display area MDA and the peripheral area DPA have a thickness of about 2,000 Å, a step difference of about 2,000 Å may exist between an area, from which the second insulating layer 115b is removed, and an area, in which the second insulating layer 115b is arranged. In this case, when the transparent connection line TCW is arranged in a portion where a step difference exists between the area, from which the second insulating layer 115b is removed, and the area, in which the second insulating layer 115b is arranged, it may cause a problem such as disconnection of the transparent connection line TCW due to the step difference.

Thus, the transparent connection line TCW may not be arranged in a portion where a step difference exists between the area, from which the second insulating layer 115b is removed, and the area, in which the second insulating layer 115b is arranged.

Also, as the transmittance of the component area CA may be degraded or reduced when the metal connection line MCW is arranged in the component area CA, the metal connection line MCW may not be arranged in the component area CA.

In an embodiment, at least a portion of the second insulating layer 115b arranged over the peripheral area DPA adjacent to the component area CA may be removed. For example, the second insulating layer 115b may not be arranged in at least a portion of the peripheral area DPA and the component area CA. The opening OP formed in the second insulating layer 115b may overlap at least a portion of the peripheral area DPA.

In an embodiment, the transparent connection line TCW may be arranged in the opening OP formed in the second insulating layer 115b. The transparent connection line TCW may be arranged over the component area CA and may at least partially extend toward the peripheral area DPA adjacent to the component area CA.

In an embodiment, the metal connection line MCW may be arranged over the peripheral area DPA. In an embodiment, the metal connection line MCW may be thicker than the transparent connection line TCW. In an embodiment, the metal connection line MCW may have a thickness of about 7,000 Å in a direction (e.g., z direction) perpendicular to the substrate 100. Alternatively, the metal connection line MCW may have the same thickness as the transparent connection line TCW or may be thinner than the transparent connection line TCW.

In an embodiment, the transparent connection line TCW and the metal connection line MCW may be arranged on different layers. In an embodiment, the transparent connection line TCW may be disposed directly on the first insulating layer 115a, and the metal connection line MCW may be disposed directly on the second insulating layer 115b.

A first organic insulating layer 116 may be arranged over the transparent connection line TCW and the metal connection line MCW. The first organic insulating layer 116 may be integrally formed over the main display area MDA, the component area CA, and the peripheral area DPA. A first contact hole CNT1 and a second contact hole CNT2 may be formed in the first organic insulating layer 116. The first contact hole CNT1 may overlap the metal connection line MCW, and the second contact hole CNT2 may overlap the transparent connection line TCW. For example, at least a portion of the metal connection line MCW may be exposed through the first contact hole CNT1, and at least a portion of the transparent connection line TCW may be exposed through the second contact hole CNT2.

In an embodiment, the thickness of the first organic insulating layer 116 arranged over the transparent connection line TCW and the thickness of the first organic insulating layer 116 arranged over the metal connection line MCW may be different from each other. For example, as the transparent connection line TCW is arranged in the area from which the second insulating layer 115b is removed, the thickness of the first organic insulating layer 116 arranged over the transparent connection line TCW may be greater than the thickness of the first organic insulating layer 116 arranged over the metal connection line MCW. Due to the difference in thickness of the first organic insulating layer 116, a difference may occur in the size of the contact hole formed in the first organic insulating layer 116. For example, when the contact holes formed in the first organic insulating layer 116 are designed to have the same size, a portion exposed by the contact hole formed in the first organic insulating layer 116 having a small thickness may be wide and a portion exposed by the contact hole formed in the first organic insulating layer 116 having a great thickness may be small.

Thus, as the size of the contact hole (e.g., the second contact hole CNT2) formed in the first organic insulating layer 116 arranged over the transparent connection line TCW may be designed to be greater than the size of the contact hole (e.g., the first contact hole CNT1) formed in the first organic insulating layer 116 arranged over the metal connection line MCW, the occurrence of a difference in the size (e.g., area) of the portion exposed by the contact hole may be prevented or minimized. For example, as the size of the contact hole (e.g., the second contact hole CNT2) at the surface of the first organic insulating layer 116 arranged over the transparent connection line TCW may be designed to be about 3 µm×4 µm and the size of the contact hole (e.g., the first contact hole CNT1) at the surface of the first organic insulating layer 116 arranged over the metal connection line MCW may be designed to be about 2.8 µm×3.5 µm, the transparent connection line TCW and the metal connection line MCW may be exposed to have the substantially same exposed size (e.g., substantially same exposed area).

A connection line CW may be arranged over the first organic insulating layer 116. The transparent connection line TCW and the metal connection line MCW arranged on different layers may be electrically connected through the connection line CW. In an embodiment, one end of the connection line CW may be electrically connected to the metal connection line MCW through the first contact hole CNT1, and the other end of the connection line CW may be electrically connected to the transparent connection line TCW through the second contact hole CNT2. In an embodiment, the connection line CW and the main connection electrode CMm described above with reference to FIG. 7 may be arranged on the same layer (e.g., the first organic insulating layer 116).

Figure 10:
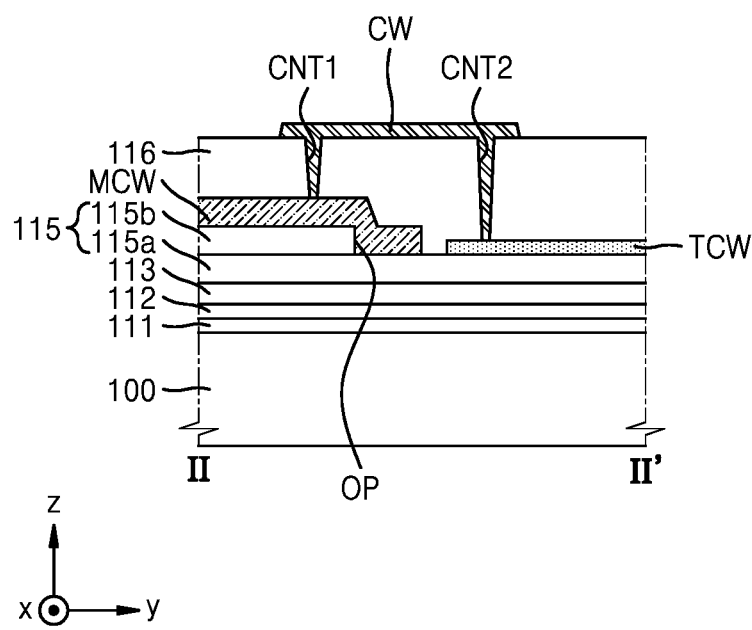
FIG. 10 is a cross-sectional view taken along lines II-IF of FIG. 8 illustrating another example of the metal connection line and the transparent connection line of the display panel of the display apparatus of FIG. 1.

FIG. 10 is a cross-sectional view schematically illustrating a display apparatus according to an embodiment. The embodiment of FIG. 10 may be different from the embodiment of FIG. 9 in that at least a portion of the metal connection line MCW is disposed directly on the first insulating layer 115a. In FIG. 10, like reference numerals as those in FIG. 9 denote like members, and thus redundant descriptions thereof will be omitted for descriptive convenience.

Referring to FIG. 10, in an embodiment, at least a portion of the second insulating layer 115b arranged over the component area CA and the peripheral area DPA adjacent to the component area CA may be removed. For example, the second insulating layer 115b may not be arranged in at least a portion of the peripheral area DPA and the component area CA.

In an embodiment, as the second insulating layer 115b is not arranged in at least a portion of the peripheral area DPA and the component area CA, the second insulating layer 115b may include an opening OP. At least a portion of the first insulating layer 115a arranged thereunder may be exposed through the opening OP formed in the second insulating layer 115b. In an embodiment, the opening OP formed in the second insulating layer 115b may at least partially overlap the component area CA and/or the peripheral area DPA.

In an embodiment, a transparent connection line TCW may be arranged in the opening OP formed in the second insulating layer 115b. In an embodiment, the transparent connection line TCW may be disposed directly on the first insulating layer 115a exposed by the opening OP formed in the second insulating layer 115b.

In an embodiment, a metal connection line MCW may be arranged over the second insulating layer 115b. The metal connection line MCW may not overlap the transparent connection line TCW. In an embodiment, at least a portion of the metal connection line MCW may be arranged in the opening OP formed in the second insulating layer 115b. The metal connection line MCW may be arranged over the second insulating layer 115b, and at least a portion of the metal connection line MCW may extend to a portion where a step difference exists between an area, from which the second insulating layer 115b is removed, and an area, in which the second insulating layer 115b is arranged. Thus, the metal connection line MCW may cover the portion having a step difference between the area where the second insulating layer 115b is removed and the area where the second insulating layer 115b is arranged, and may be arranged over the second insulating layer 115b and the first insulating layer 115a exposed by the opening OP formed in the second insulating layer 115b.

A first organic insulating layer 116 may be arranged over the transparent connection line TCW and the metal connection line MCW. The first organic insulating layer 116 may be integrally formed over the main display area MDA, the component area CA, and the peripheral area DPA. A first contact hole CNT1 and a second contact hole CNT2 may be formed in the first organic insulating layer 116.

In an embodiment, the thickness of the first insulating layer 115a arranged over the first insulating layer 115a, the second insulating layer 115b, and the metal connection line MCW, the thickness of the first organic insulating layer 116 arranged over the first organic insulating layer 116 and the metal connection line MCW, and the thickness of the first organic insulating layer 116 arranged over the second insulating layer 115b and the transparent connection line TCW may be different from each other. In an embodiment, the thickness of the first insulating layer 115a arranged over the first insulating layer 115a, the second insulating layer 115b, and the metal connection line MCW may be less than the thickness of the first organic insulating layer 116 arranged over the first organic insulating layer 116 and the metal connection line MCW, and the thickness of the first organic insulating layer 116 arranged over the first organic insulating layer 116 and the metal connection line MCW may be less than the thickness of the first organic insulating layer 116 arranged over the second insulating layer 115b and the transparent connection line TCW.

Thus, the sizes of the contact holes formed in the first organic insulating layer 116 may be changed or varied according to the difference in thickness of the first organic insulating layer 116. For example, as the thickness of the first organic insulating layer 116 increases, the length of the contact hole may increase. Thus, the size of the portion exposed by the contact hole may decrease.

As the size of the contact hole is designed differently according to the thickness of the first organic insulating layer 116, the amount of the difference in the size (e.g., area) of the portion exposed by the contact hole may be prevented or minimized. For example, as the size of the contact hole (e.g., the second contact hole CNT2) at the surface of the first organic insulating layer 116 arranged over the transparent connection line TCW may be designed to be about 3 μm×4 μm and the size of the contact hole (e.g., the first contact hole CNT1) at the surface of the first organic insulating layer 116 arranged over the first insulating layer 115a, the second insulating layer 115b, and the metal connection line MCW may be designed to be about 2.8 μm×3.5 μm, the transparent connection line TCW and the metal connection line MCW may be exposed to have the substantially same exposed size (e.g., substantially same exposed area).

Also, the first contact hole CNT1 may overlap the metal connection line MCW disposed directly on the first insulating layer 115a. In this case, as the size of the contact hole (e.g., the second contact hole CNT2) at the surface of the first organic insulating layer 116 arranged over the transparent connection line TCW may be designed to be about 3 μm×4 μm and the size of the contact hole (e.g., the first contact hole CNT1) at the surface of the first organic insulating layer 116 arranged over the first insulating layer 115a and the metal connection line MCW may be designed to be about 2.8 μm×3.5 μm, the transparent connection line TCW and the metal connection line MCW may be exposed to have the substantially same exposed size (e.g., substantially same exposed area).

Figure 11:
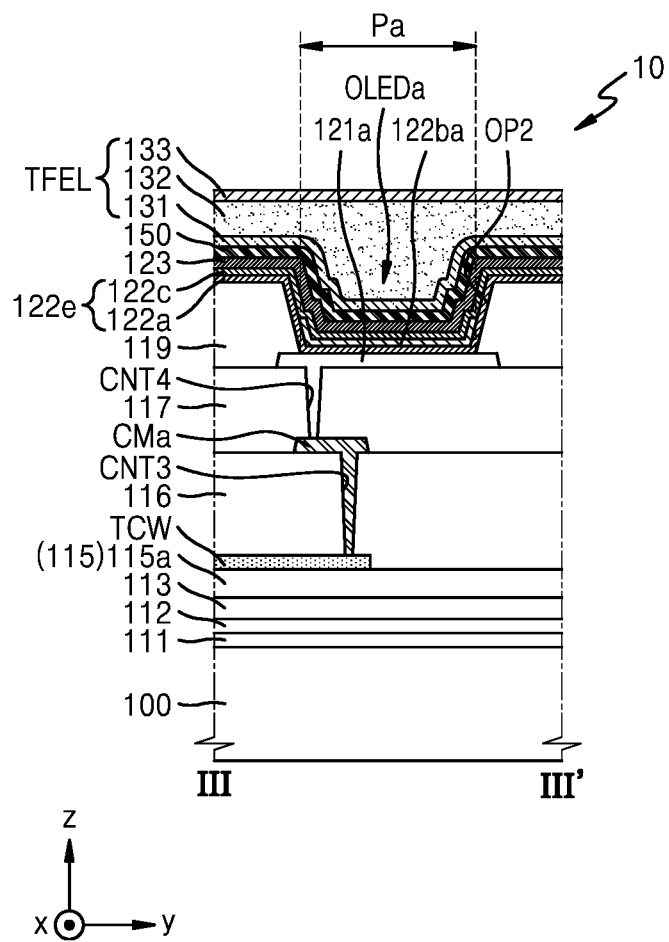
FIG. 11 is a cross-sectional view taken along lines of FIG. 8.

FIG. 11 is a cross-sectional view schematically illustrating a display apparatus according to an embodiment. For example, FIG. 11 is a cross-sectional view of the display apparatus taken along line of FIG. 8.

Referring to FIGS. 8 and 11, the second insulating layer 115b may not be arranged in the component area CA. For example, the interlayer insulating layer 115 of the component area CA may include only the first insulating layer 115a. A transparent connection line TCW may be arranged over the first insulating layer 115a of the component area CA.

A first organic insulating layer 116 may be arranged over the transparent connection line TCW, and an auxiliary connection electrode CMa may be arranged over the first organic insulating layer 116. The auxiliary connection electrode CMa, the main connection electrode CMm (see FIG. 7), and/or the connection line CW (see FIG. 9) may be arranged on the same layer and may include the same material. The auxiliary connection electrode CMa may be electrically connected to the transparent connection line TCW through a third contact hole CNT3 formed in the first organic insulating layer 116.

A second organic insulating layer 117 may be arranged over the auxiliary connection electrode CMa. An auxiliary organic light emitting diode OLEDa may be arranged over the second organic insulating layer 117. The auxiliary organic light emitting diode OLEDa may include an auxiliary pixel electrode 121a, an auxiliary emission layer 122ba, and an opposite electrode 123.

An auxiliary pixel electrode 121a may be arranged over the second organic insulating layer 117. The auxiliary connection electrode CMa and the main pixel electrode 121m described above may be arranged on the same layer (e.g., the first organic insulating layer 116) and may include the same material.

The auxiliary pixel electrode 121a may be electrically connected to the auxiliary connection electrode CMa through a fourth contact hole CNT4 formed in the second organic insulating layer 117. Thus, the auxiliary pixel circuit PCa (see FIG. 8) may be electrically connected to the auxiliary organic light emitting diode OLEDa.

A pixel definition layer 119 may be arranged on the auxiliary pixel electrode 121a. The pixel definition layer 119 may include a second opening OP2 exposing at least a portion of the auxiliary pixel electrode 121a.

An auxiliary emission layer 122ba may be arranged in the second opening OP2 formed in the pixel definition layer 119. The auxiliary emission layer 122ba may include the same material as the main emission layer 122bm described above. An organic functional layer 122e may be arranged over and/or under the auxiliary emission layer 122ba. The organic functional layer 122e may include a first functional layer 122a and/or a second functional layer 122c. Alternatively, the first functional layer 122a and/or the second functional layer 122c may be omitted.

An opposite electrode 123 may be arranged over the auxiliary emission layer 122ba. The opposite electrode 123 may be integrally provided in the main display area MDA and the component area CA. A top layer 150 may be arranged over the opposite electrode 123.

A thin film encapsulation layer TFEL may be arranged over the top layer 150, and the auxiliary organic light emitting diode OLEDa may be encapsulated by the thin film encapsulation layer TFEL. The thin film encapsulation layer TFEL may prevent external moisture or foreign substances from penetrating into the auxiliary organic light emitting diode OLEDa. The thin film encapsulation layer TFEL may include a first inorganic layer 131, an organic layer 132, and a second inorganic layer 133.

Figure 12:
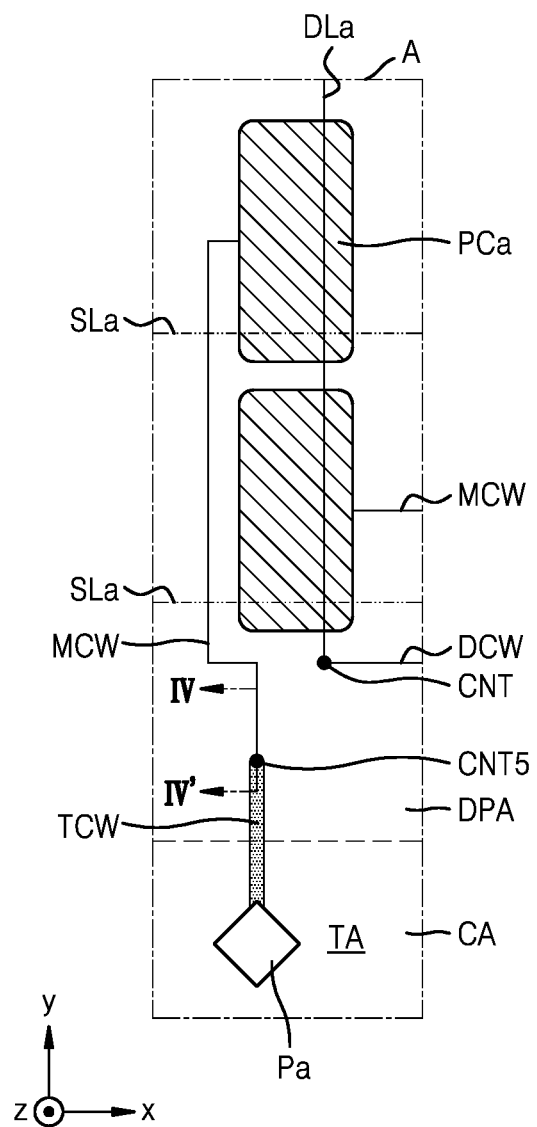
FIG. 12 is an enlarged view of region A of FIG. 6 illustrating another example of the component area and the peripheral area of the display panel of the display apparatus of FIG. 1.
Figure 13:
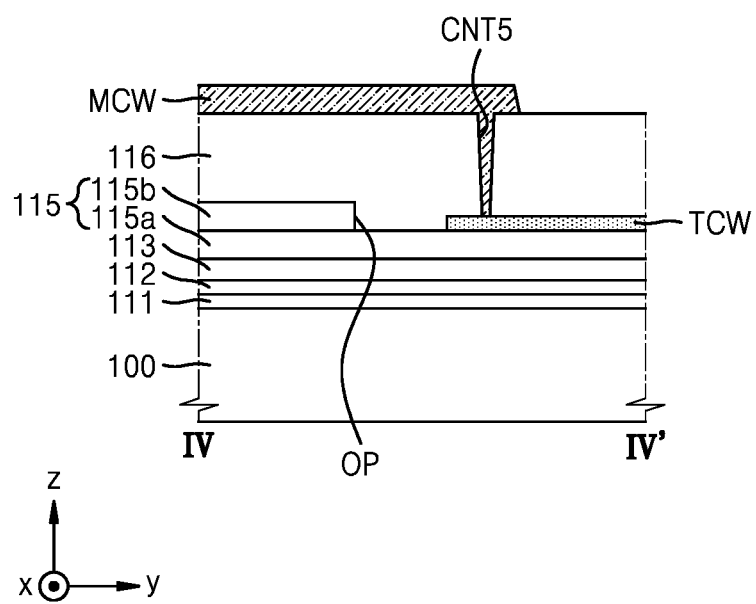
FIG. 13 is a cross-sectional view taken along lines IV-IV' of FIG. 12 illustrating an example of the metal connection line and the transparent connection line of the display panel of the display apparatus of FIG. 1.

FIG. 12 is a plan view schematically illustrating a display apparatus according to an embodiment, and FIG. 13 is a cross-sectional view schematically illustrating a display apparatus according to an embodiment. The embodiment of FIGS. 12 and 13 may be different from the embodiment of FIGS. 8 and 9 in that the metal connection line MCW is arranged over the first organic insulating layer 116. In FIGS. 12 and 13, like reference numerals as those in FIGS. 8 and 9 denote like members, and thus redundant descriptions thereof will be omitted for descriptive convenience.

Referring to FIGS. 12 and 13, the interlayer insulating layer 115 may include a first insulating layer 115a and a second insulating layer 115b. The second insulating layer 115b may include an opening OP exposing at least a portion of the first insulating layer 115a. The transparent connection line TCW may be arranged in the opening OP formed in the second insulating layer 115b. Thus, the transparent connection line TCW may be disposed directly on the first insulating layer 115a.

In an embodiment, a first organic insulating layer 116 may be arranged over the interlayer insulating layer 115 and the transparent connection line TCW. In an embodiment, a fifth contact hole CNT5 may be formed in the first organic insulating layer 116.

A metal connection line MCW may be arranged over the first organic insulating layer 116. The metal connection line MCW, the main connection electrode CMm (see FIG. 7), and/or the auxiliary connection electrode CMa (see FIG. 11) described above may be arranged on the same layer and may include the same material. The metal connection line MCW arranged over the first organic insulating layer 116 may be electrically connected to the transparent connection line TCW through the fifth contact hole CNT5 formed in the first organic insulating layer 116.

In an embodiment, the metal connection line MCW arranged over the first organic insulating layer 116 may at least partially overlap a portion where a step difference exists between an area from which the second insulating layer 115b is removed and an area in which the second insulating layer 115b is arranged.

In an embodiment, adjacent metal connection lines MCW may be arranged on different layers. In an embodiment, some of the metal connection lines MCW may be arranged over the second insulating layer 115b as illustrated in FIG. 9, and the other metal connection lines MCW may be arranged over the first organic insulating layer 116 as illustrated in FIG. 13. For example, when the metal connection lines MCW include a first metal connection line and a second metal connection line adjacent to each other, the first metal connection line may be arranged over the second insulating layer 115b, and the second metal connection line may be arranged over the first organic insulating layer 116. Thus, the adjacent metal connection lines MCW may be alternately arranged on different layers. As the adjacent metal connection lines MCW are alternately arranged on different layers, the area in which the metal connection lines MCW are arranged may be reduced, and thus, it may be advantageous for high integration.

Figure 14:
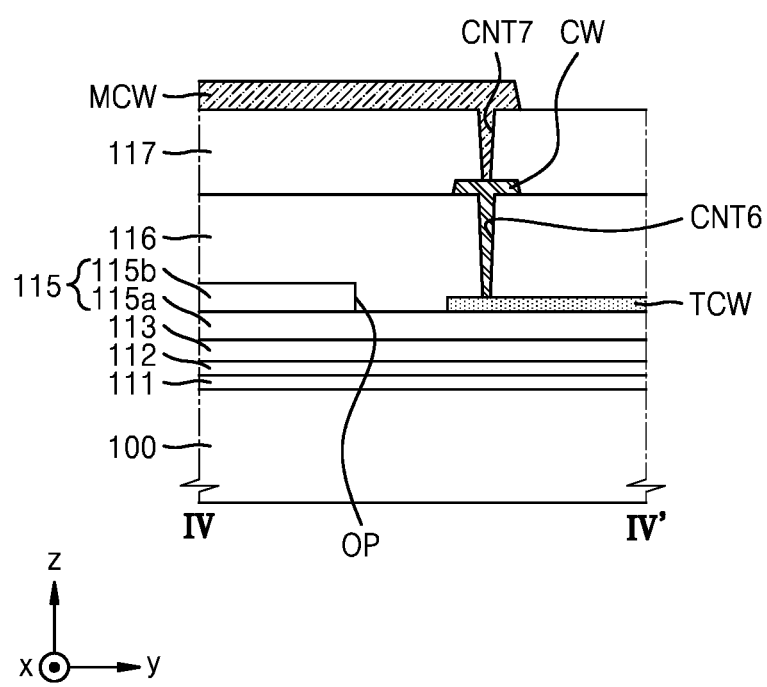
FIG. 14 is a cross-sectional view taken along lines IV-IV' of FIG. 12 illustrating another example of the metal connection line and the transparent connection line of the display panel of the display apparatus of FIG. 1.

FIG. 14 is a cross-sectional view schematically illustrating a display apparatus according to an embodiment. The embodiment of FIG. 14 may be different from the embodiment of FIG. 13 in that the metal connection line MCW is arranged over the second organic insulating layer 117. In FIG. 14, like reference numerals as those in FIG. 13 denote like members, and thus redundant descriptions thereof will be omitted for descriptive convenience.

Referring to FIG. 14, the interlayer insulating layer 115 may include a first insulating layer 115a and a second insulating layer 115b. The second insulating layer 115b may include an opening OP exposing at least a portion of the first insulating layer 115a. The transparent connection line TCW may be arranged in the opening OP formed in the second insulating layer 115b. Thus, the transparent connection line TCW may be disposed directly on the first insulating layer 115a.

In an embodiment, a first organic insulating layer 116 may be arranged over the interlayer insulating layer 115 and the transparent connection line TCW. In an embodiment, a sixth contact hole CNT6 may be formed in the first organic insulating layer 116.

In an embodiment, a connection line CW may be arranged over the first organic insulating layer 116. The connection line CW, the main connection electrode CMm (see FIG. 7), and/or the auxiliary connection electrode CMa (see FIG. 11) described above may be arranged on the same layer and may include the same material. The connection line CW may be electrically connected to the transparent connection line TCW through the sixth contact hole CNT6 formed in the first organic insulating layer 116.

In an embodiment, a second organic insulating layer 117 may be arranged over the connection line CW. In an embodiment, a seventh contact hole CNT7 may be formed in the second organic insulating layer 117.

In an embodiment, a metal connection line MCW may be arranged over the second organic insulating layer 117. The metal connection line MCW, the main pixel electrode 121m (see FIG. 7), and/or the auxiliary pixel electrode 121a (see FIG. 11) described above may be arranged on the same layer and may include the same material. In an embodiment, the metal connection line MCW may be electrically connected to the connection line CW through the seventh contact hole CNT7 formed in the second organic insulating layer 117. Thus, the metal connection line MCW may be electrically connected to the transparent connection line TCW.

In an embodiment, adjacent metal connection lines MCW may be arranged on different layers. In an embodiment, some of the metal connection lines MCW may be arranged over the second insulating layer 115b as illustrated in FIG. 9, some of the metal connection lines MCW may be arranged over the first organic insulating layer 116 as illustrated in FIG. 13, and the other metal connection lines MCW may be arranged over the second organic insulating layer 117 as illustrated in FIG. 14. As the adjacent metal connection lines MCW are alternately arranged on different layers, it may be advantageous for high integration. For example, when the metal connection lines MCW include a first metal connection line, a second metal connection line, and a third metal connection line adjacent to each other, the first metal connection line may be arranged over the second insulating layer 115b, the second metal connection line may be arranged over the first organic insulating layer 116, and the third metal connection line may be arranged over the second organic insulating layer 117. Thus, the adjacent metal connection lines MCW may be alternately arranged on different layers. As the adjacent metal connection lines MCW are alternately arranged on different layers, the area in which the metal connection lines MCW are arranged may be reduced. Thus, it may be advantageous for high integration.

Figure 15:
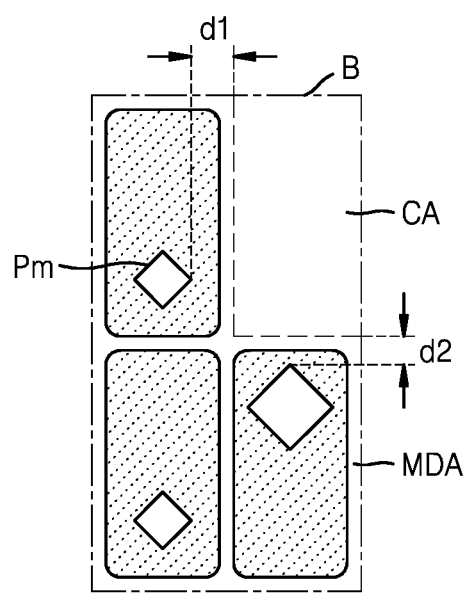
FIG. 15 is an enlarged view of region B of FIG. 6.

FIG. 15 is a plan view schematically illustrating a display apparatus according to an embodiment. For example, FIG. 15 is an enlarged view of region B of FIG. 6, which is to describe that the component area CA and the main display element most adjacent to the component area CA are spaced apart from each other by a certain distance. FIG. 15 is a partial schematic view for convenience of description.

Referring to FIG. 15, a main subpixel Pm may be arranged in the main display area MDA. The main subpixel Pm may include a main organic light emitting diode OLEDm (see FIG. 7) as a main display element.

As described above with reference to FIG. 9, the second insulating layer 115b of the interlayer insulating layer 115 arranged over the component area CA may be removed. For example, the second insulating layer 115b may be arranged in the main display area MDA, but the second insulating layer 115b may not be arranged in the component area CA. The second insulating layer 115b arranged in the main display area MDA may include an opening OP corresponding to the component area CA. An end of the opening OP formed in the second insulating layer 115b arranged in the main display area MDA may match a boundary of the component area CA.

In an embodiment, the component area CA may be spaced apart by a first distance d1 or more from the main subpixel Pm that is most adjacent to the component area CA in the x direction. In an embodiment, the component area CA may be spaced apart by a second distance d2 or more from the main subpixel Pm that is most adjacent to the component area CA in the y direction. In this case, the first distance d1 and the second distance d2 may be about 10 μm. Also, as the component area CA may be spaced apart from the most adjacent main subpixels Pm by 10 μm or more, the degradation of the transmittance of the component area CA may be prevented or minimized.

FIGS. 16 to 21 are cross-sectional views schematically illustrating a method of manufacturing a display apparatus, according to an embodiment.

Hereinafter, a method of manufacturing a display apparatus will be schematically described with reference to FIGS. 16 to 21.

Figure 16:
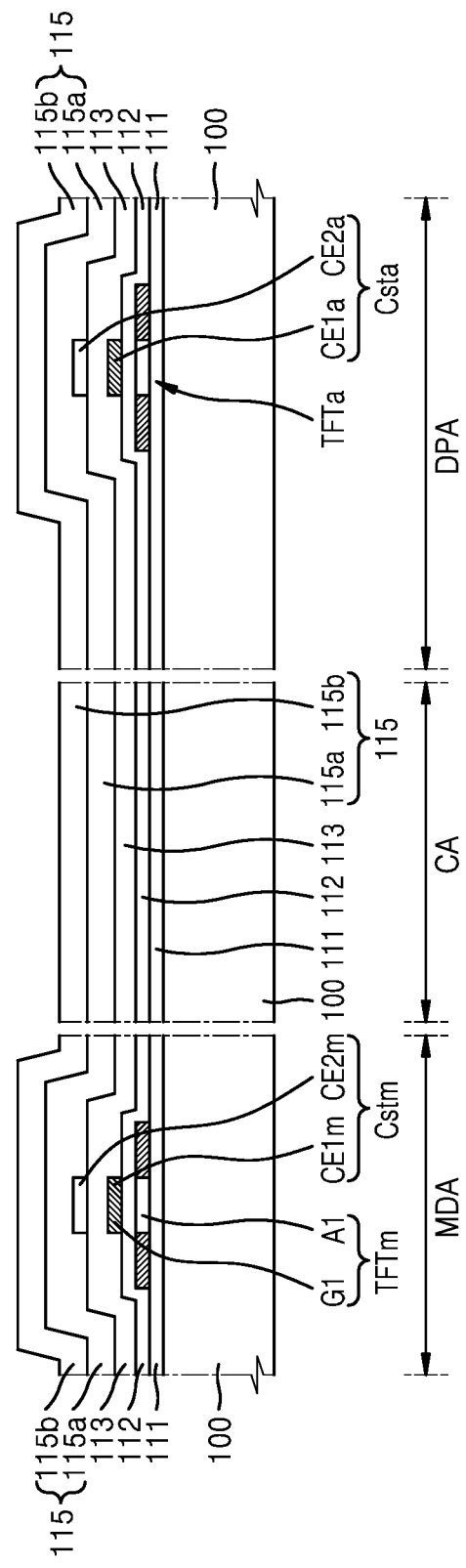
FIGS. 16 to 21 are cross-sectional views schematically illustrating an embodiment of a method of manufacturing the display apparatus of FIG. 1.

Referring to FIG. 16, the display apparatus may include a main display area MDA, a component area CA, and a peripheral area DPA. In an embodiment, a substrate 100 may include a main display area MDA, a component area CA, and a peripheral area DPA.

A buffer layer 111, a first gate insulating layer 112, and a second gate insulating layer 113 may be arranged over the substrate 100. A main thin film transistor TFTm and a main storage capacitor Cstm may be arranged over the main display area MDA. An auxiliary thin film transistor TFTa and an auxiliary storage capacitor Csta may be arranged over the peripheral area DPA.

The main thin film transistor TFTm may include a semiconductor layer A1 and a gate electrode G1 as described above with reference to FIG. 7. The auxiliary thin film transistor TFTa may have the same shape as the main thin film transistor TFTm.

The main storage capacitor Cstm may include a main upper electrode CE2m and a main lower electrode CE1m as described above with reference to FIG. 7. The auxiliary storage capacitor Csta may include an auxiliary lower electrode CE1a and an auxiliary upper electrode CE2a. The auxiliary lower electrode CE1a and the main lower electrode CE1m may be arranged on the same layer and include the same material. The auxiliary upper electrode CE2a and the main upper electrode CE2m may be arranged on the same layer and include the same material.

In an embodiment, an interlayer insulating layer 115 may be arranged over the substrate 100. The interlayer insulating layer 115 may be provided to cover the main upper electrode CE2m and the auxiliary upper electrode CE2a. The interlayer insulating layer 115 may include a first insulating layer 115a and a second insulating layer 115b arranged over the first insulating layer 115a. The second insulating layer 115b may be disposed directly on the first insulating layer 115a. In an embodiment, the first insulating layer 115a may include silicon oxide ($SiO_x$), and the second insulating layer 115b may include silicon nitride ($SiN_x$).

Figure 17:
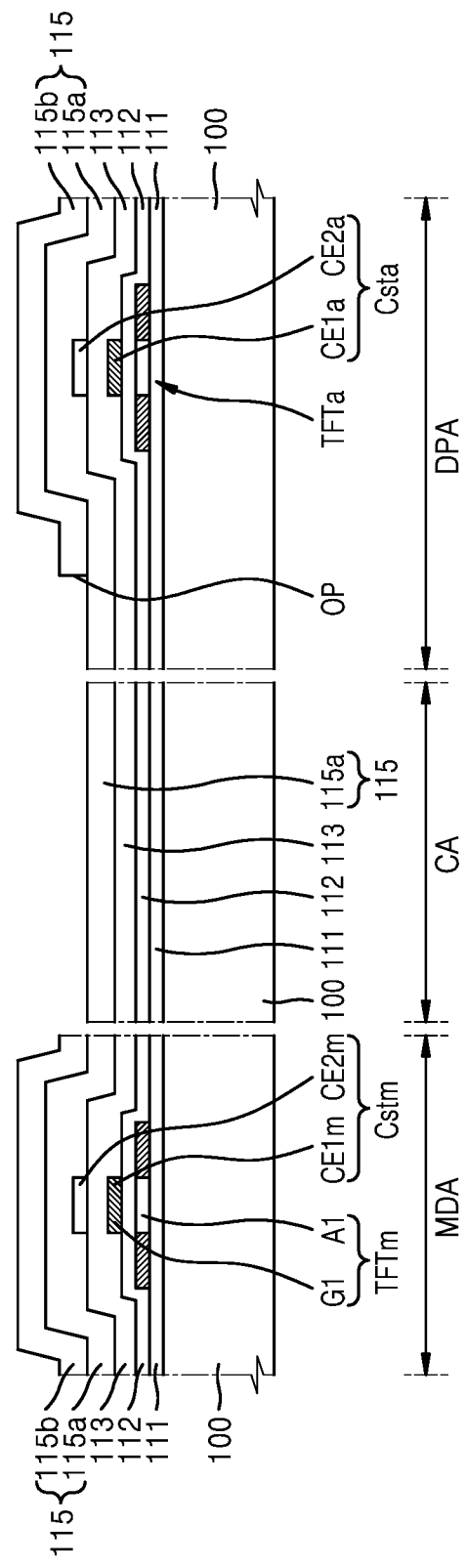

Referring to FIG. 17, after a process of forming the interlayer insulating layer 115, a process of at least partially removing the second insulating layer 115b arranged in the component area CA and the second insulating layer 115b arranged in the peripheral area DPA may be performed.

In an embodiment, the second insulating layer 115b of the interlayer insulating layer 115 arranged in the component area CA may be removed. For example, the second insulating layer 115b of the interlayer insulating layer 115 may be arranged in the main display area MDA and the peripheral area DPA, but the second insulating layer 115b may not be arranged in the component area CA.

In an embodiment, at least a portion of the second insulating layer 115b arranged over the peripheral area DPA adjacent to the component area CA may be removed. For example, the second insulating layer 115b may not be arranged in at least a portion of the peripheral area DPA and the component area CA.

As the second insulating layer 115b arranged in at least a portion of the peripheral area DPA and the component area CA is removed, the second insulating layer 115b arranged over the peripheral area DPA may include an opening OP exposing at least a portion of the first insulating layer 115a. In an embodiment, the opening OP formed in the second insulating layer 115b may at least partially overlap the component area CA and the peripheral area DPA.

Figure 18:
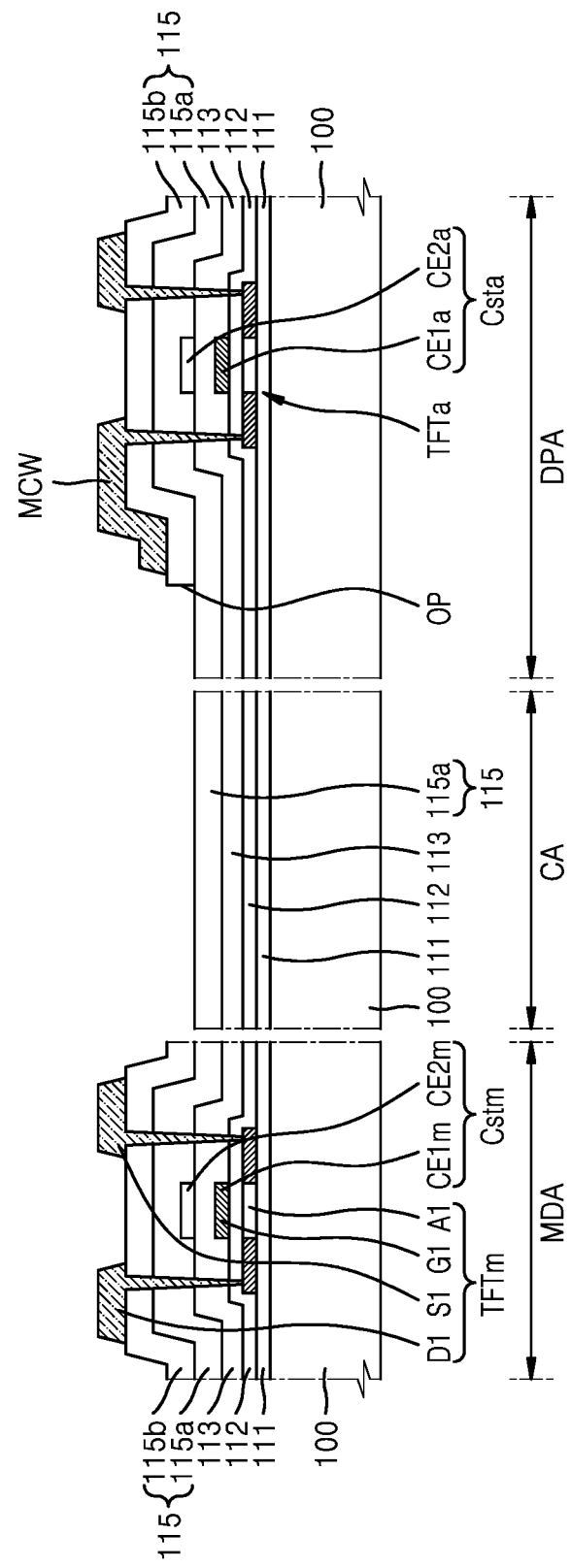

Thereafter, referring to FIG. 18, a process of forming a source electrode S1 and a drain electrode D1 over the interlayer insulating layer 115 may be performed.

In an embodiment, a source electrode S1 and a drain electrode D1 may be formed over the interlayer insulating layer 115. For example, a source electrode S1 and a drain electrode D1 may be formed over the second insulating layer 115b of the peripheral area DPA and the main display area MDA.

The main thin film transistor TFTm may include a source electrode S1 and a drain electrode D1. The auxiliary thin film transistor TFTa may also include a source electrode S1 and a drain electrode D1.

A metal connection line MCW may be formed over the second insulating layer 115b of the peripheral area DPA. In an embodiment, the metal connection line MCW may be disposed directly on the second insulating layer 115b. Although FIG. 18 illustrates that the metal connection line MCW is integrally provided with the source electrode S1 and/or the drain electrode D1, embodiments are not limited thereto. In an embodiment, the metal connection line MCW, the source electrode S1, and/or the drain electrode D1 may be arranged on the same layer (e.g., the interlayer insulating layer 115), but may be arranged apart from the source electrode S1 and/or the drain electrode D1. In this case, the metal connection line MCW may be electrically connected to the source electrode S1 and/or the drain electrode D1 through a separate line. In an embodiment, the metal connection line MCW may be electrically connected to the auxiliary thin film transistor TFTa.

Figure 19:
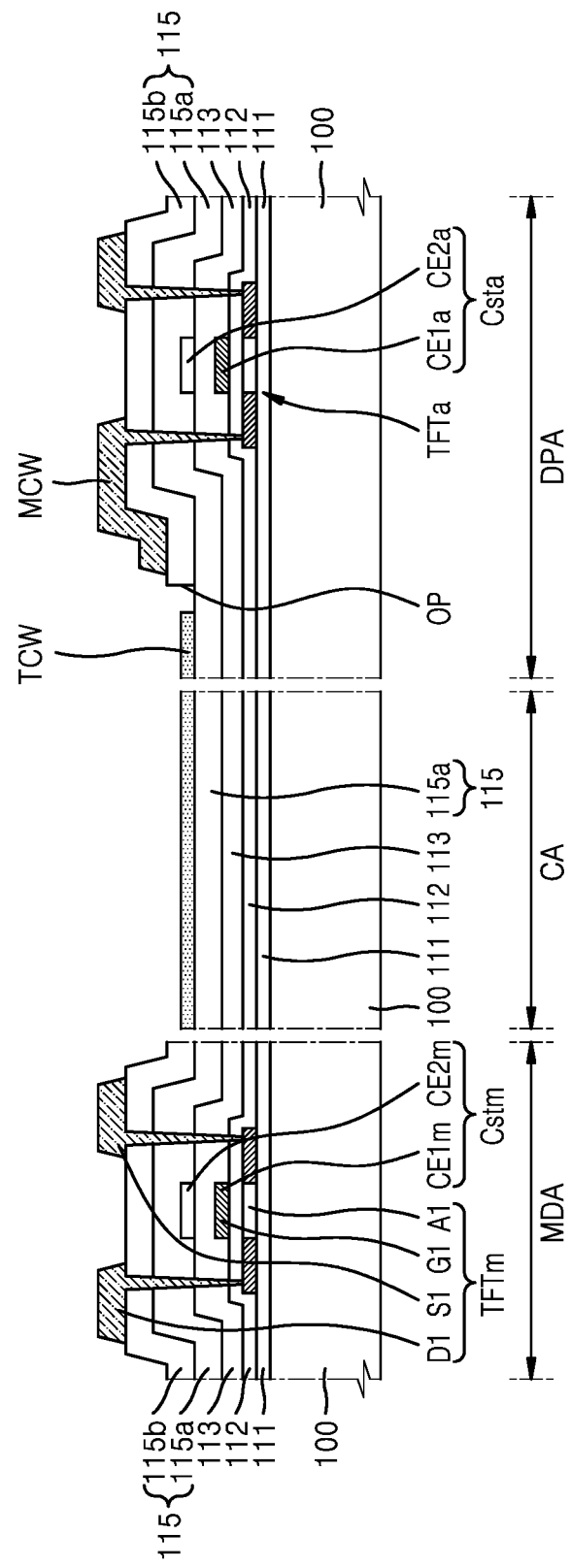

Referring to FIG. 19, after a process of forming the metal connection line MCW over the second insulating layer 115b, a process of forming a transparent connection line TCW over at least a portion of the peripheral area DPA and the component area CA, from which the second insulating layer 115b has been removed, may be performed.

In an embodiment, the second insulating layer 115b may include an opening OP. In an embodiment, at least a portion of the first insulating layer 115a may be exposed through the opening OP formed in the second insulating layer 115b. In an embodiment, the opening OP formed in the second insulating layer 115b may at least partially overlap the component area CA and the peripheral area DPA.

In an embodiment, a transparent connection line TCW may be arranged in the opening OP formed in the second insulating layer 115b. In an embodiment, the transparent connection line TCW may be disposed directly on the first insulating layer 115a. The transparent connection line TCW may be arranged over the component area CA and may at least partially extend toward the peripheral area DPA adjacent to the component area CA. As described above with reference to FIG. 9, the transparent connection line TCW may have a first thickness t1 in a direction (e.g., z direction) perpendicular to the substrate 100, and the first thickness t1 may be about 100 Å to about 2,000 Å.

Figure 20:
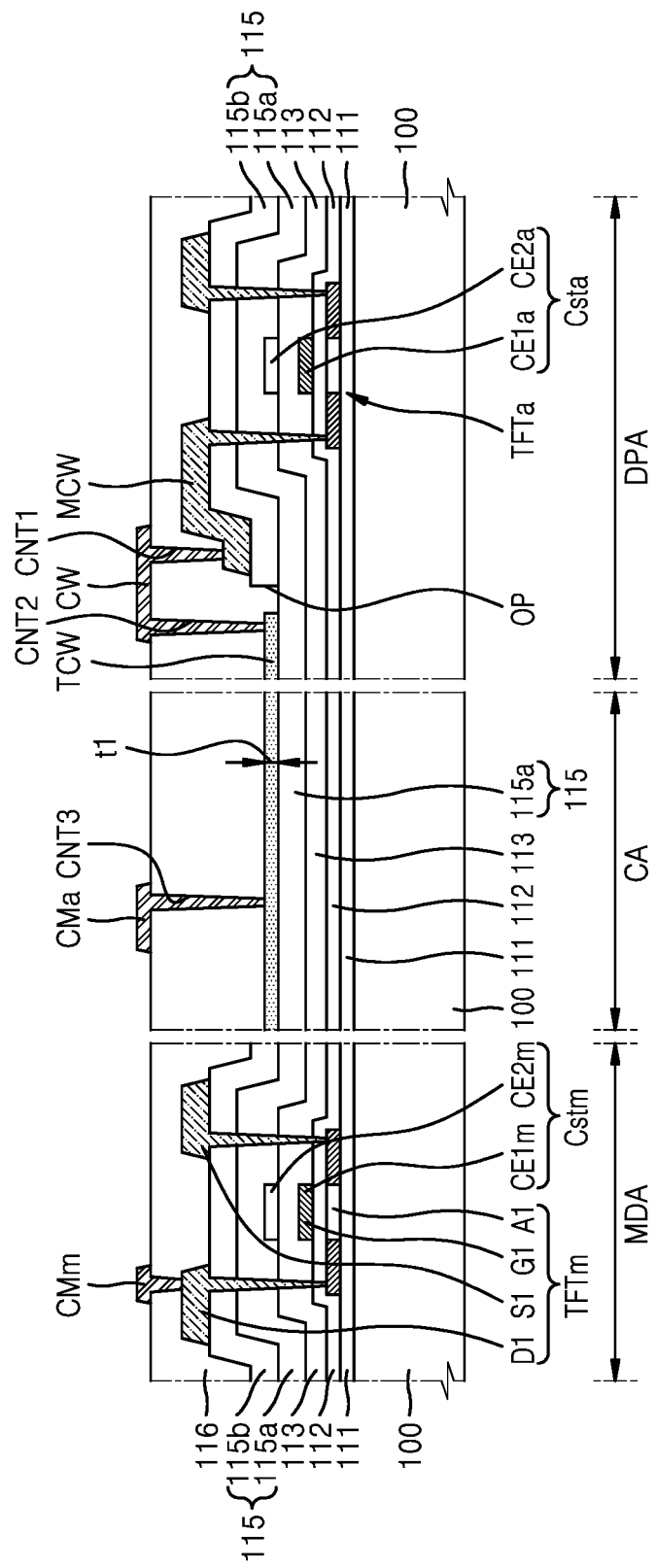

Referring to FIG. 20, after a process of forming the transparent connection line TCW, a process of forming a first organic insulating layer 116 over the transparent connection line TCW and the metal connection line MCW and a process of forming a main connection electrode CMm, an auxiliary connection electrode CMa, and a connection line CW over the first organic insulating layer 116 may be performed.

In an embodiment, the main connection electrode CMm may be arranged over the main display area MDA, the auxiliary connection electrode CMa may be arranged over the component area CA, and the connection line CW may be arranged over the peripheral area DPA.

The connection line CW arranged over the peripheral area DPA may be electrically connected to the metal connection line MCW and the transparent connection line TCW through a first contact hole CNT1 and a second contact hole CNT2. For example, one end of the connection line CW may be electrically connected to the metal connection line MCW through the first contact hole CNT1, and the other end of the connection line CW may be electrically connected to the transparent connection line TCW through the second contact hole CNT2. Thus, the metal connection line MCW may be electrically connected to the transparent connection line TCW.

Also, the auxiliary connection electrode CMa arranged over the component area CA may be electrically connected to the transparent connection line TCW through a third contact hole CNT3.

Figure 21:
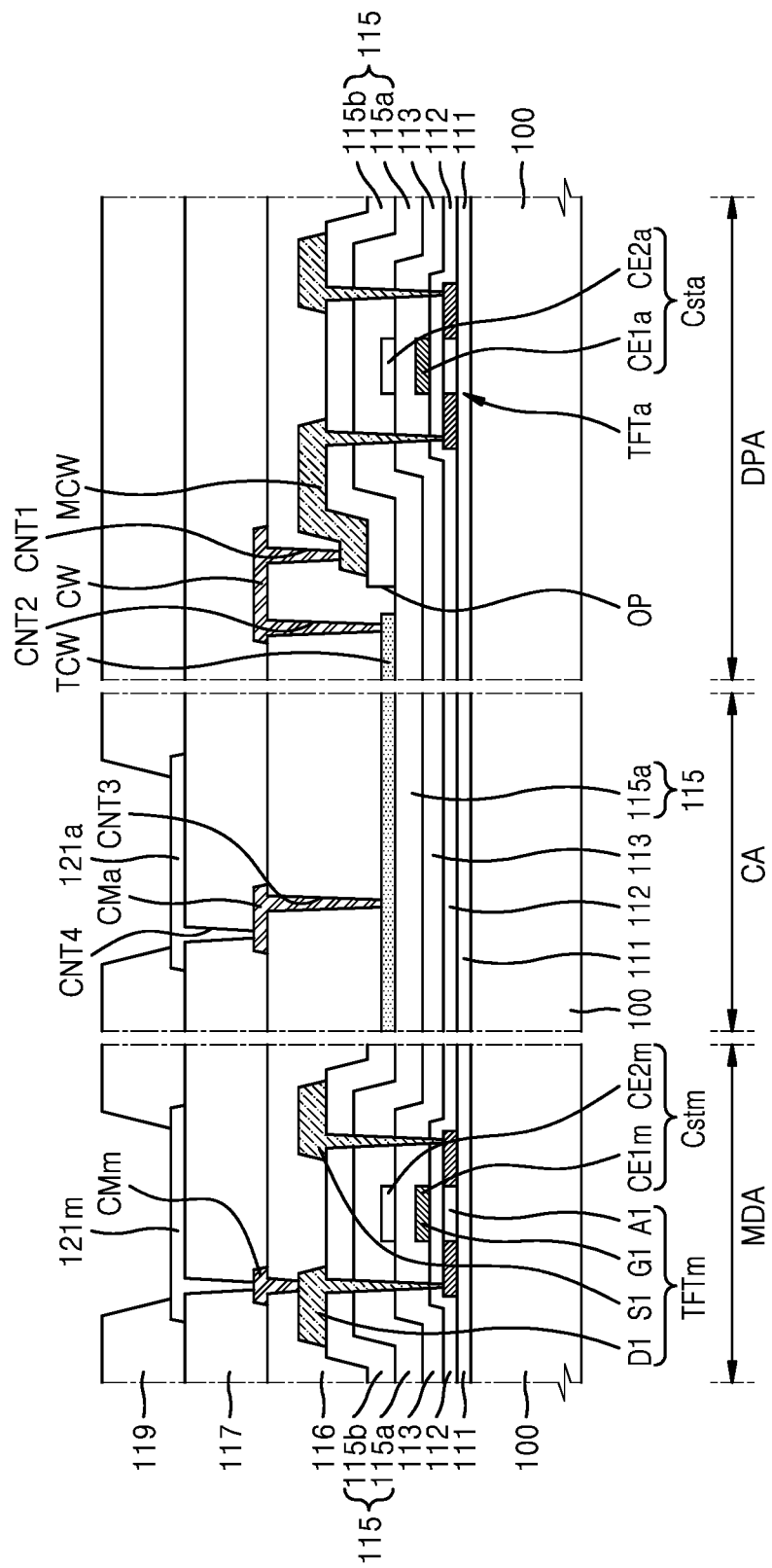

Thereafter, referring to FIG. 21, after a process of forming the main connection electrode CMm, the auxiliary connection electrode CMa, and the connection line CW, a process of forming a second organic insulating layer 117 over the main connection electrode CMm, the auxiliary connection electrode CMa, and the connection line CW and a process of forming a main pixel electrode 121m and an auxiliary pixel electrode 121a over the second organic insulating layer 117 may be performed.

In an embodiment, a second organic insulating layer 117 may be formed over the main connection electrode CMm, the auxiliary connection electrode CMa, and the connection line CW. Also, in an embodiment, a main pixel electrode 121m and an auxiliary pixel electrode 121a may be formed over the second organic insulating layer 117.

The main pixel electrode 121m may be formed over the main display area MDA, and the auxiliary pixel electrode 121a may be formed over the component area CA. In an embodiment, the auxiliary pixel electrode 121a formed over the component area CA may be electrically connected to the auxiliary connection electrode CMa through a fourth contact hole CNT4 formed in the second organic insulating layer 117. Thus, the auxiliary pixel electrode 121a may be electrically connected to the auxiliary connection electrode CMa through the fourth contact hole CNT4, the auxiliary connection electrode CMa may be electrically connected to the transparent connection line TCW through the third contact hole CNT3, the transparent connection line TCW may be electrically connected to the connection line CW through the second contact hole CNT2, and the connection line CW may be electrically connected to the metal connection line MCW through the first contact hole CNT1. Thus, the auxiliary pixel electrode 121a may be electrically connected to the auxiliary thin film transistor TFTa.

A pixel definition layer 119 may be formed over the main pixel electrode 121m and the auxiliary pixel electrode 121a. The pixel definition layer 119 may include an opening exposing at least a portion of the main pixel electrode 121m and the auxiliary pixel electrode 121a.

As described above, in the display apparatus according to the embodiments, as the pixel circuit is not arranged in the component area, a wider transmission area may be secured or implemented and thus the transmittance thereof may be improved or increased.

Also, as a portion of the insulating layer arranged over the component area is removed, the transmittance distribution of the component area may be reduced or decreased and simultaneously the transmittance of the component area may be improved or increased.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
a substrate comprising a main display area, a component area, and a peripheral area;
a first insulating layer disposed over the substrate;
a second insulating layer disposed over the first insulating layer and comprising an opening exposing at least a portion of the first insulating layer;
an auxiliary subpixel disposed over the component area;
an auxiliary pixel circuit disposed over the peripheral area and comprising an auxiliary thin film transistor and an auxiliary storage capacitor; and
a transparent connection line connecting the auxiliary subpixel to the auxiliary pixel circuit and at least partially disposed over the component area.

2. The display apparatus of claim 1, wherein the transparent connection line is disposed in the opening.

3. The display apparatus of claim 2, wherein:
the transparent connection line is disposed directly on the first insulating layer,
the component area is an auxiliary display area having a transmission area, and
the auxiliary subpixel is an auxiliary light emitting element,
the auxiliary pixel circuit is configured to drive the auxiliary light emitting element.

4. The display apparatus of claim 2, wherein the transparent connection line has a thickness of about 100 Å to about 2,000 Å.

5. The display apparatus of claim 1, wherein the first insulating layer and the second insulating layer comprise different materials, and the second insulating layer is disposed directly on the first insulating layer.

6. The display apparatus of claim 5, wherein the first insulating layer comprises silicon oxide, and the second insulating layer comprises silicon nitride.

7. The display apparatus of claim 1, wherein the opening overlaps the component area.

8. The display apparatus of claim 7, wherein the opening overlaps at least a portion of the peripheral area.

9. The display apparatus of claim 1, further comprising a metal connection line electrically connected to the transparent connection line and disposed over the peripheral area.

10. The display apparatus of claim 9, further comprising:
a first organic insulating layer disposed over the first insulating layer; and
a second organic insulating layer disposed over the first organic insulating layer.

11. The display apparatus of claim 10, wherein the metal connection line is disposed over the second insulating layer of the peripheral area.

12. The display apparatus of claim 11, wherein the metal connection line and the transparent connection line are electrically connected through a connection line disposed over the first organic insulating layer.

13. The display apparatus of claim 12, wherein one end of the connection line is electrically connected to the metal connection line through a first contact hole, and another end of the connection line is electrically connected to the transparent connection line through a second contact hole.

14. The display apparatus of claim 10, wherein the metal connection line is disposed over the first organic insulating layer.

15. The display apparatus of claim 14, wherein the metal connection line and the transparent connection line are electrically connected through a third contact hole formed in the first organic insulating layer.

16. The display apparatus of claim 10, wherein the metal connection line is disposed over the second organic insulating layer.

17. The display apparatus of claim 16, wherein the metal connection line and the transparent connection line are electrically connected through a connection line disposed over the first organic insulating layer.

18. The display apparatus of claim 17, wherein one end of the connection line is electrically connected to the metal connection line through a fourth contact hole, and another end of the connection line is electrically connected to the transparent connection line through a fifth contact hole.

19. The display apparatus of claim 1, further comprising:
a main pixel circuit comprising a main thin film transistor and a main storage capacitor disposed over the main display area; and
a main subpixel disposed over the main display area and electrically connected to the main pixel circuit,
wherein the first insulating layer and the second insulating layer are disposed between the main pixel circuit and the main subpixel.

20. The display apparatus of claim 19, wherein the component area and the main subpixel most adjacent to the component area are spaced apart from each other by about 10 μm or more.

21. A display apparatus comprising:
a substrate comprising a main display area, an auxiliary display area having a transmission area, and a peripheral area;
a first insulating layer extending to overlap the main display area, the auxiliary display area, and the peripheral area;
a second insulating layer disposed over the first insulating layer and comprising an opening exposing at least a portion of the first insulating layer in the auxiliary display area;
an auxiliary subpixel comprising an auxiliary light emitting element disposed in the auxiliary display area and an auxiliary pixel circuit disposed in the peripheral area, the auxiliary pixel circuit configured to drive the auxiliary light emitting element; and
a transparent connection line connecting the auxiliary light emitting element to the auxiliary pixel circuit and at least partially disposed over the auxiliary display area.

* * * * *